US007001704B2

(12) United States Patent
Oshima et al.

(10) Patent No.: US 7,001,704 B2
(45) Date of Patent: Feb. 21, 2006

(54) PRESENSITIZED LITHOGRAPHIC PLATE COMPRISING MICROCAPSULES

(75) Inventors: Yasuhito Oshima, Shizuoka (JP); Sumiaki Yamasaki, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 71 days.

(21) Appl. No.: 10/765,928

(22) Filed: Jan. 29, 2004

(65) Prior Publication Data

US 2004/0253544 A1 Dec. 16, 2004

(30) Foreign Application Priority Data

Jan. 29, 2003 (JP) ............................ 2003-020880
Jan. 31, 2003 (JP) ............................ 2003-024825
Aug. 15, 2003 (JP) ............................ 2003-293736

(51) Int. Cl.
*G03C 1/77* (2006.01)
*G03C 1/91* (2006.01)
*G03F 7/085* (2006.01)
*G03F 7/09* (2006.01)
*G03F 7/14* (2006.01)

(52) U.S. Cl. ................ 430/138; 430/271.1; 430/278.1; 430/302; 430/964

(58) Field of Classification Search ................ 430/138, 430/271.1, 278.1, 302, 964
See application file for complete search history.

(56) References Cited

U.S. PATENT DOCUMENTS 4,999,273 A * 3/1991 Hasegawa .................. 430/138
6,566,029 B1 * 5/2003 Kawamura et al. ......... 430/138
6,884,560 B1 * 4/2005 Yanaka et al. .............. 430/138
2001/0018159 A1 * 8/2001 Maemoto .................... 430/138
2002/0031715 A1 * 3/2002 Maemoto .................... 430/138
2002/0033108 A1 * 3/2002 Akiyama et al. ........... 101/457
2003/0129520 A1 * 7/2003 Oohashi et al. ............. 430/138

FOREIGN PATENT DOCUMENTS

EP 1 057 622 A2 12/2000
EP 1 160 083 A2 12/2001
EP 1 266 767 A2 12/2002
EP 1 287 985 A2 3/2003
JP 2000211262 8/2000
JP 2002029162 1/2002
JP 2002046361 2/2002

OTHER PUBLICATIONS

Machine translation of JP 2000-211262, Publication Date Aug. 2, 2000, Asahi Chem. Ind. Co. Ltd. (JP 2000-211262 and an English Abstract was previously submitted with the IDS filed on Jul. 8, 2005).

* cited by examiner

*Primary Examiner*—Richard L. Schilling
(74) *Attorney, Agent, or Firm*—Sughrue Mion, PLLC

(57) ABSTRACT

A presensitized lithographic printing plate comprises a hydrophilic support and an image-forming layer. The image-forming layer contains microcapsules and a hydrophilic compound. The microcapsules are dispersed in the image forming layer. The hydrophilic compound is arranged outside of the microcapsules. The microcapsules comprise a core and a shell. The core comprises a polymerizable compound. The shell comprises a polymer. The polymer of the shell has adherence to a surface of the hydrophilic support.

35 Claims, 6 Drawing Sheets

PRESENSITIZED LITHOGRAPHIC PLATE COMPRISING MICROCAPSULES

FIELD OF THE INVENTION

The present invention relates to a presensitized lithographic printing plate comprising a hydrophilic support and an image-forming layer in which microcapsules containing a polymerizable compound are dispersed and also in which a hydrophilic binder is further contained outside of the microcapsules.

BACKGROUND OF THE INVENTION

A lithographic printing plate generally comprises a hydrophobic imaging area, which receives oily ink in a printing process, and a hydrophilic non-imaging area, which receives dampening water. A conventional lithographic process usually comprises steps of masking a presensitized (PS) plate, which comprises a hydrophilic support and a hydrophobic photosensitive resin layer, with a lith film, exposing the plate to light through the lith film, and then developing the plate to remove a non-imaging area with a developing solution.

Nowadays a computer electronically processes, stores and outputs image information as digital data. A presensitized lithographic plate is preferably scanned directly with a highly directive active radiation such as a laser beam without use of a lith film to form an image according to a digital data. The term of Computer to Plate (CTP) means the lithographic process of forming a printing plate according to digital image data without use of a lith film.

The conventional lithographic process of forming a printing plate has a problem about CTP that a wavelength region of a laser beam does not match a spectral sensitivity of a photosensitive resin.

The conventional PS plate requires a step of dissolving and removing a non-imaging area (namely, developing step). The developed printing plate should be further subjected to post-treatments such as a washing treatment using water, a rinsing treatment using a solution of a surface-active agent, and a desensitizing treatment using a solution of gum arabic or a starch derivative. The additional wet treatments are disadvantageous to the conventional PS plate. Even if an early step (image-forming step) in a lithographic process is simplified according to a digital treatment, the late step (developing step) comprises such troublesome wet treatments that the process as a whole cannot be sufficiently simplified.

The printing industry as well as other industries is interested in protection of global environment. Wet treatments inevitably influence global environment. The wet treatments are preferably simplified, changed into dry treatments or omitted from a lithographic process to protect global environment.

A process without wet treatments is referred to as a press development method, which comprises the steps of attaching an exposed presensitized printing plate to a cylinder of a printer, and rotating the cylinder while supplying dampening water and ink to the plate to remove a non-imaging area from the plate. Immediately after exposing the presensitized plate to light, the plate can be installed in a printer. A lithographic process can be completed while conducting an usual printing treatment.

A presensitized lithographic printing plate suitable for the press development method must have a photosensitive layer soluble in dampening water or a solvent of ink. The presensitized plate should easily be treated under room light to be subjected to a press development in a printer placed under room light.

A conventional PS plate cannot satisfy the above-described requirements.

Japanese Patent No. 2,938,397 (corresponding to European Patent No. 0770494, and U.S. Pat. Nos. 6,030,750 and 6,096,481) discloses a method for making a lithographic printing plate. The method uses an imaging element (presensitized plate) comprising on a hydrophilic surface of a lithographic based an image forming layer comprising hydrophobic thermoplastic polymer particles capable of coalescing under the influence of heat and dispersed in a hydrophilic binder and a compound capable of converting light to heat. The method comprising the steps of imagewise exposing to light the imaging element; and developing a thus obtained imagewise exposed imaging element by mounting it on a print cylinder of a printing press and supplying an aqueous dampening liquid or ink to the image forming layer while rotating the printer cylinder.

The imaging element can be treated under room light because the element has sensitivity within an infrared region.

In the method for making a lithographic printing plate, polymer particles coalesce under the influence of heat converted from light. Imaging elements having particles suitable for a press development often show poor plate wear.

Japanese Patent Publication Nos. 2000-211262, 2001-277740, 2002-29162, 2002-46361, 2002-137562 and 2002-326470 disclose presensitized lithographic printing plate in which microcapsules containing a polymerizable compound are dispersed in place of the thermoplastic polymer particles. An image formed by reaction of the polymerizable compound has stronger durability and gives better plate wear than an image made of the melted and aggregated particles. However, the polymerizable compound is so highly reactive that it must be enclosed in the microcapsules to isolate. The shell of the microcapsules is made of thermo-decomposing polymer.

As described in Japanese Patent Publication No. 2000-211262, if a polymer having an addition-polymerizable functional group is used in the shell, the shell can contribute to the image-forming reaction. As described in Japanese Patent Publication No. 2002-326470, if the substance enclosed in the microcapsules can interact with a surface of the support, the image can also be formed by the interaction.

SUMMARY OF THE INVENTION

Japanese Patent Publication No. 2000-211262 discloses a shell containing an addition-polymerizable functional group. Accordingly, a presensitized plate using the shell can form an image improved in plate wear. However, the polymerization reaction of the addition-polymerizable functional group is liable to be inhibited by oxygen in air. The shell of the microcapsules is more affected by air compared with the core.

An object of the present invention is to provide a improved presensitized lithographic printing plate, which can form a lithographic printing plate having excellent plate wear.

The present invention provides a presensitized lithographic printing plate which comprises a hydrophilic support and an image-forming layer containing microcapsules dispersed in the image forming layer and a hydrophilic compound arranged outside of the microcapsules, wherein microcapsules comprises a core comprising a polymerizable compound and a shell comprising a polymer which has adherence to a surface of the hydrophilic support.

The polymer of the shell can have adherence to the surface of the hydrophilic support, for example according to the following embodiments of the present invention.

In the first embodiment of the invention, the polymer of the shell has a cationic group, the hydrophilic compound arranged outside of the microcapsules has a nonionic hydrophilic group, and the hydrophilic surface of the support has an anionic group.

In the second embodiment of the invention, the polymer of the shell has a group having a function of forming an aluminum complex, and the hydrophilic support is an aluminum plate.

In the third embodiment of the invention, the polymer of the shell has a lactone ring.

The present invention also provides a lithographic process comprising the steps of: imagewise heating a presensitized lithographic printing plate which comprises a hydrophilic support and an image-forming layer containing microcapsules dispersed in the image forming layer and a hydrophilic compound arranged outside of the microcapsules, wherein mictocapsules comprises a core comprising a polymerizable compound and a shell comprising a polymer which has adherence to a surface of the hydrophilic support, whereby the shell is decomposed, the polymer of the shell adheres to the surface of the hydrophilic support, and the polymerizable compound is polymerized to form a hydrophobic area; and removing the unheated area of the image-forming layer to form a lithographic printing plate in which the exposed surface of the hydrophilic support is the hydrophilic area and the remaining image-forming layer is the hydrophobic area.

In the case that the image-forming layer or another optional layer further contains an agent capable of converting light to heat, the presensitized lithographic printing plate is exposed to a scanning laser beam, which imagewise heats the plate by converting light to heat.

The unheated area of the image-forming layer can be removed by adding dampening water, adding oily ink or rubbing the image-forming layer.

In the first embodiment of the invention, an ionic bond is formed between the cationic group of the shell polymer and the anionic group of the hydrophilic surface of the support whereby the polymer of the shell adheres to the surface of the hydrophilic support.

In the second embodiment of the invention, a coordinate bond is formed between the functional group of the shell polymer and the aluminum plate to form an aluminum. complex whereby the polymer of the shell adheres to the surface of the hydrophilic support.

In the third embodiment of the invention, a chemical bond is formed between the lactone ring of the shell polymer and the hydrophilic surface of the support whereby the polymer of the shell adheres to the surface of the hydrophilic support.

The invention further provides a lithographic printing process comprising the steps of: imagewise heating a presensitized lithographic printing plate which comprises a hydrophilic support and an image-forming layer containing microcapsules dispersed in the image forming layer and a hydrophilic compound arranged outside of the microcapsules, wherein microcapsules comprises a core comprising a polymerizable compound and a shell comprising a polymer which has adherence to a surface of the hydrophilic support, whereby the shell is decomposed, the polymer of the shell adheres to the surface of the hydrophilic support, and the polymerizable compound is polymerized to form a hydrophobic area; working a printer in which the plate is installed whereby the unheated area of the image-forming layer is removed by adding dampening water, adding oily ink or rubbing the image-forming layer to form a lithographic printing plate in which the exposed surface of the hydrophilic support is the hydrophilic area and the remaining image-forming layer is the hydrophobic area; and printing with the lithographic printing plate while adding the dampening water and the oily ink to the plate.

The presensitized lithographic printing plate of the invention is characterized in that the shell of the microcapsule comprises a polymer having adherence to a surface of a hydrophilic support.

In the presensitized lithographic plate before forming an image, a hydrophilic compound separates a shell polymer from a hydrophilic surface of the support surface. After the plate is imagewise heated, the shell polymer is decomposed to come in contact with the support surface. The polymer is attached and fixed on the surface. Accordingly, only the polymerizable compound of the core but also the polymer of the shell contributes to the image formation. As a result, a durable hydrophobic image is formed within the heated image area.

The reaction between the shell polymer and the hydrophilic surface of the support is not inhibited by oxygen in air while the polymerization reaction of the shell polymer disclosed in prior art is inhibited by oxygen.

Accordingly, a lithographic printing plate excellent in plate wear can be obtained by using the presensitized lithographic printing plate according to the invention.

DETAILED DESCRIPTION OF THE INVENTION

[Shell of Microcapsules]

The presensitized lithographic printing plate of the invention comprises a hydrophilic support and an image-forming layer, which comprises microcapsules, which further comprises a core and a shell, which furthermore comprises a polymer having adherence to a surface of the hydrophilic support.

Whether a polymer has adherence to a surface of the hydrophilic support or not can be determined by the following experiment.

A polymer to be tested is coated on the surface of the hydrophilic support. A transparent pressure-sensitive tape (PET tape) is attached on the coated polymer layer. The tape and the polymer layer are peeled from the hydrophilic support by adding weight. The weight at which the tape and the polymer layer are peeled is measured. In the case that the measured weight is not less than 5 g, the polymer is considered to have adherence to a surface of the hydrophilic support. In the case that the measured weight is less than 5 g, the polymer is considered to have no adherence.

[Shell Polymer of First Embodiment]

Figure 1:
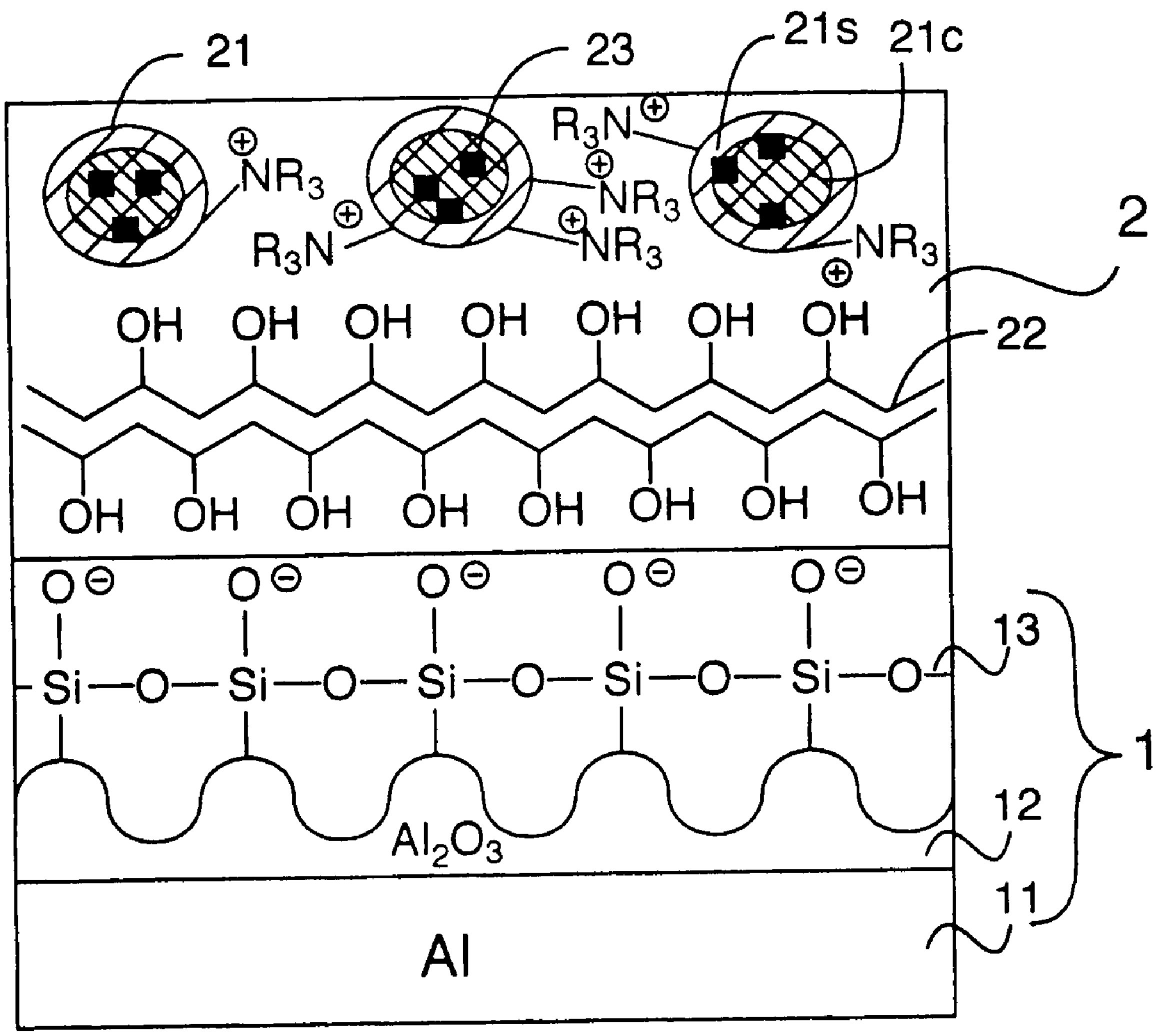
FIG. 1 is a sectional view schematically illustrating a presensitized lithographic plate of the first embodiment.

FIG. 1 is a sectional view schematically illustrating a presensitized lithographic plate of the first embodiment.

The presensitized lithographic plate shown in FIG. 1 comprises a hydrophilic support (1) and an image-forming layer (2).

The hydrophilic support (1) comprises an aluminum plate (11) and an anodic oxidation coating (12), which has a hydrophilic surface subjected to a silicate treatment (13). The hydrophilic surface (13) has an anionic group ($—O^-$) formed by the silicate treatment.

In the image-forming layer (2), microcapsules (21) are dispersed in a hydrophilic binder (22). Each of the microcapsules (21) comprises a core (21*c*) and a shell (21*s*). In the core/shell structure of the microcapsule, the core (21*c*) comprises a polymerizable compound, and the shell (21*s*) comprises a polymer. In the presensitized lithographic plate shown in FIG. 1, the core further comprises an agent capable of converting light to heat. The hydrophilic binder (22) has a nonionic hydrophilic group (—OH), and the polymer of the shell (21*s*) has a cationic group ($—N^+R_3$).

The hydrophilic binder (22) essentially separates the cationic group ($—N^+R_3$) of the shell (21*s*) from the anionic group ($—O^-$) of the hydrophilic support (1). Accordingly, an ionic bond is scarcely formed between the cationic group and the anionic group before processing the presensitized plate.

In the first embodiment, the shell polymer has a cationic group. The cationic group preferably is an onium group (such as ammonium group, phosphonium group, arsonium group, stibonium group, oxonium group, sulfonium group, selenonium group, stannonium group, iodonium group). The ammonium group, the phosphonium group, the sulfonium group and the iodonium group are preferred, the ammonium group and the phosphonium group are more preferred and the ammonium group is most preferred. The shell polymer can have another hydrophilic group (anionic group, nonionic hydrophilic group) in addition to the cationic group.

The ammonium group is defined by the formula (I), the phosphonium group is defined by the formula (II), the arsonium group is defined by the formula (III), the stibonium group is defined by the formula (IV), the oxonium group is defined by the formula (V), the sulfonium group is defined by the formula (VI), the selenonium group is defined by the formula (VII), the stannonium group is defined by the formula (VIII), and the iodonium group is defined by the formula (IX).

Ammonium group: $—N^+R_3$ (I)

Phosphonium group: $—P^+R_3$ (II)

Arsonium group: $—As^+R_3$ (III)

Stibonium group: $—Sb^+R_3$ (IV)

oxonium group: $—O^+R_2$ (V)

Sulfonium: $—S^+R_2$ (VI)

Selenonium group: $—Se^+R_2$ (VII)

Stannonium group: $—Sn^+R_2$ (VIII)

Iodonium group: $—I^+R$ (IX)

In the formulas, R is hydrogen atom, an aliphatic group, an aromatic group or a heterocyclic group. Two or more groups of R in one onium group can be different from each other.

In the present specification, the aliphatic group can have a cyclic or branched structure. The aliphatic group preferably has 1–30 carbon atoms, more preferably has 1–20 carbon atoms, further preferably has 1–15 carbon atoms, furthermore preferably has 1–10 carbon atoms, still furthermore preferably has 1–8 carbon atoms, and most preferably has 1–6 carbon atoms.

The aliphatic group can have a substituent group. Examples of the substituent groups include a halogen atom (F, Cl, Br, I), hydroxyl, mercapto, formyl, amino, ammonio, carboxyl, carbamoyl, carbamoyloxy, sulfo, ureido, sulfinamoyl, sulfamoyl, silyl, hydroxysilyl, phosphono, cyano, nitro, an aromatic group, a heterocyclic group, —O—R, —S—R, —S—S—R, —CO—R, —NH—R, $—N(—R)_2$, $—N^+H_2—R$, $—N^+H(—R)_2$, $—N^+(—R)_3$, —CO—O—R, —O—CO—R, —S—CO—R, —CO—NH—R, $—CO—N(—R)_2$, —NH—CO—R, —N(—R)—CO—R, —SO—R, $—SO_2—R$, $—SO_2—O—R$, $—O—SO_2—R$, —NH—CO—NH—R, $—NH—CO—N(—R)_2$, —N(—R)—CO—NH—R, $—N((—R)—CO—N(—R)_2$, —NH—CO—O—R, —NH—O—CO—R, —N(—R)—CO—O—R, —N(—R)—O—CO—R, —SO—NH—R, $—SO—N(—R)_2$, $—SO_2—NH—R$, $—SO_2—N(—R)_2$, $—SO_2—NH—SO_2—R$, $—CO—NH—SO_2—R$, $—Si(—O—R)_3$, —P(=O)(—OH)(—O—R) and $—P(=O)(—O—R)_2$. In the formulas, R is an aliphatic group, an aromatic group or a heterocyclic group. A hydrogen atom can be dissociated from carboxyl, sulfo, the sulfuric ester group, phosphono and the phosphoric ester group. Carboxyl, sulfo, the sulfuric ester group, phosphono and the phosphoric ester group can also be in the form of a salt.

In the present specification, the aromatic group preferably has 6 to 30 carbon atoms, more preferably has 6 to 20 carbon atoms, further preferably has 6 to 15 carbon atoms, and most preferably 6 to 10 carbon atoms.

The aromatic group can have a substituent group. Examples of the substituent groups include an aliphatic group in addition to the examples of substituent groups of the aliphatic group.

In the present specification, the heterocyclic group preferably has 1–30 carbon atoms, more preferably has 1–20 carbon atoms, further preferably has 1–15 carbon atoms, furthermore preferably has 1–10 carbon atoms, still furthermore preferably has 1–8 carbon atoms, and most preferably has 1–6 carbon atoms.

The heterocyclic group can have a substituent group. Examples of the substituent groups are the same as the examples of the substituent groups of the aromatic group.

The cationic group is preferably placed on the surface of the microcapsule. Accordingly, the cationic group is preferably attached to the side chain of the shell polymer rather than the main chain.

The main chain of the shell polymer preferably is a polymer of condensation polymerization rather than a polymer of addition polymerization. The main chain more preferably is polyurethane, polyurea, polyester, polyamide, a copolymer thereof or a mixture thereof, and most preferably is polyurethane, polyurea, a copolymer thereof or a mixture thereof.

The polyurethane has an urethane bond (—NH—CO—O—) in its main chain, the polyurea has an urea bond (—NH—CO—NH—) in its main chain, the polyester has an ester bond (—CO—O—) in its main chain, the polyamide has an amido bond (—CO—NH—) in its main chain, and the copolymer has two or more kinds of those bonds in its main chain.

The polyurethane, the polyurea and the copolymer thereof can be synthesized by a reaction of a polyisocyanate with a polyol or polyamine. The polyurethane, the polyurea and the copolymer thereof can also be synthesized by a condensation reaction of a polyisocyanate with a polyamine obtained by hydrolysis of polyisocyanate. The shell polymer of microcapsules is preferably prepared by the steps of: reacting 1 mole of an n-valent polyol with n mole of a polyisocyanate to synthesize adduct as an intermediate; and reacting the adduct to obtain the shell polymer. In a practical procedure, the multivalent isocyanate in excess (more than n mole) of the polyol is usually added to the reaction system. Further, in some cases, the polyisocyanate is reacted with not only the polyol but also a nucleophilic compound (e.g., alcohol, phenol, thiol, amine) having a nucleophilic group (e.g., hydroxyl, mercapto, amino). In other cases, the adduct of the polyol with the polyisocyanate can be reacted and partly modified with the nucleophilic compound to prepare the shell polymer. The alcohol can be in the form of a polymer having hydroxyl at the terminal (a polymer having a cationic group and hydroxyl if the cationic group is introduced into the polymer).

The shell polymer is most preferably prepared by the steps of: introducing a cationic group into the polyol or the nucleophilic compound used with the polyol (not into the polyisocyanate); reacting the cationic compound with the multivalent isocyanate to synthesize an isocyanate adduct; and reacting the adduct to prepare the shell polymer.

The cationic compound used in the synthesis of the shell polymer is preferably represented by the following formula (X):

$$L^1Ct_mZ_n \qquad (X)$$

in which $L^1$ is a (m+n)-valent linking group; each of m and n independently is an integer of 1 to 100; Ct is a cationic group; and z is a nucleophilic group.

The linking group $L^1$ preferably is an aliphatic group having two or more valences, an aromatic group having two or more valences, a heterocyclic group having two or more valences, —O—, —S—, —NH—, —N<, —CO—, —SO—, —$SO_2$— or a combination thereof.

Each of m and n preferably is an integer of 1 to 50, more preferably is an integer of 1 to 20, further preferably is an integer of 1 to 10, and most preferably is an integer of 1 to 5.

The group of Z preferably is OH, SH or $NH_2$, more preferably is OH or $NH_2$, and most preferably is OH.

The cationic compound is more preferably an alcohol, phenol or polyol represented by the following formula (XI):

$$L^2On_m(OH)_n \qquad (XI)$$

in which $L^2$ is a (m+n)-valent linking group; each of m and n is independently an integer of 1 to 50; and On is an onium group.

Two or more cationic compounds can be used in combination.

The cationic compound can be used in combination with another polyol to prepare adduct with a polyisocyanate. Further, adduct of a cationic compound with a polyisocyanate can be used in combination with another adduct of another polyol with a polyisocyanate. Furthermore, adduct of another polyol with a polyisocyanate can be reacted with a cationic compound to prepare (modified) adduct containing the cationic group.

The polyol used together with the cationic compound preferably is a polyol having three or more functional groups, and more preferably is a compound represented by the following formula (XII):

$$L^3(—OH)_n \qquad (XII)$$

in which $L^3$ is an n-valent linking group, and n is an integer of 3 or more.

The linking group $L^3$ is preferably an aliphatic group having three or more valences, an aromatic group having three or more valences, or a combination thereof with an alkylene group, a substituted alkylene group, an arylene group, a substituted arylene group, a divalent heterocyclic group, —O—, —S—, —NH—, —CO—, —SO— or —$SO_2$—.

Examples and definitions of the aliphatic group, the aromatic group and the heterocyclic group are the same as those described above.

A polyamine can be used to form the shell polymer in addition to the cationic compound or polyol. The polyamine preferably is water-soluble. Examples of the polyamines include ethylenediamine, phenylenediamine, diethylenetriamine, triethylenetetramine and tetraethylenepentamine.

The polyisocyanate preferably is a diisocyanate represented by the following formula (XIII):

$$OCN\text{-}L^4\text{-}NCO \qquad (XIII)$$

in which $L^4$ is a divalent linking group. The linking group of $L^4$ preferably is selected from the group consisting of an alkylene group, a substituted alkylene group, an arylene group, a substituted arylene group and a combination thereof. A combination of an alkylene group and an arylene group is particularly preferred.

The alkylene group can have a cyclic or branched structure. The alkylene group preferably has 1 to 20 carbon atoms, more preferably has 1 to 15 carbon atoms, further preferably has 1 to 10 carbon atoms, and most preferably has 1 to 8 carbon atoms.

Examples of the substituent groups of the substituted alkylene or alkyl groups include a halogen atom, oxo (═O), thio (═S), an aryl group, a substituted aryl group and a alkoxy group.

The arylene group preferably is phenylene, and more preferably is p-phenylene.

Examples of the substituent group of the substituted arylene or aryl group include halogen atoms, alkyl groups, substituted alkyl groups, aryl groups, substituted aryl groups and alkoxy groups.

Examples of the diisocyanates include a xylylene diisocyanate (e.g., m-xylylene diisocyanate, p-xylylene diisocyanate), 4-chloro-m-xylylene diisocyanate, 2-methyl-m-xylylene diisocyanate, a phenylene diisocyanate (e.g., m-phenylene diisocyanate, p-phenylene diisocyanate), a toluylene diisocyanate (e.g., 2,6-toluylene diisocyanate, 2,4-toluylene diisocyanate), a naphthalene diisocyanate (e.g., naphthalene 1,4-diisocyanate), isophorone diisocyanate, an alkylene diisocyanate (e.g., trimethylene diisocyanate, hexamethylene diisocyanate, propylene 1,2-diisocyanate, butylenes 1,2-diisocyanate, cyclohexylene 1,2-diisocyanate, cyclohexylene 1,3-diisocyanate, cyclohexylene 1,4-diisocyanate, dicyclohexylmethane 1,4-diisocyanate, 1,4-bis(isocyanatomethyl)cyclohexane, 1,3-bis(isocyanatomethyl)cyclohexane), diphenylmethane 4,4'-diisocyanate, 3,3-dimethoxybiphenyl diisocyanate, 3,3-dimethyldiphenylmethane 4,4'-diisocyanate, 4,4-diphenylpropane diisocyanate, 4,4'-diphenylhexafluoropropane diisocyanate and lysine diisocyanate.

Xylylene diisocyanate and toluylene-diisocyanate are preferred, xylylene diisocyanate is more preferred, and m-xylylene diisocyanate is most preferred.

Two or more diisocyanates can be used in combination.

As is described above, the shell polymer is preferably prepared by the steps of: reacting the polyol with a polyisocyanate to synthesize adduct as an intermediate (or prepolymer), and then reacting the adduct to obtain the shell polymer.

In the synthesis reaction of the adduct, the mass ratio of polyol/isocyanate is preferably in the range of 1/100 to 80/100, and more preferably in the range of 5/100 to 50/100.

The polyol can be reacted with the polyisocyanate by heating them in an organic solvent. In the case where no catalyst is used; they are heated preferably at 50° C. to 100° C. If a catalyst is used, the reaction can proceed at a relatively low temperature (40 to 70° C.). Examples of the catalyst include tin(II) octylate and dibutyltin diacetate.

The organic solvent preferably contains no active hydrogen. Namely, alcohols, phenols and amines are not preferred. Examples of the organic solvent include an ester (e.g., ethyl acetate), a halogenated hydrocarbon (e.g., chloroform), an ether (e.g., tetrahydrofuran), a ketone (e.g., acetone), a nitrile (e.g., acetonitrile) and a hydrocarbon (e.g., toluene).

[Shell Polymer of Second Embodiment]

Figure 4:
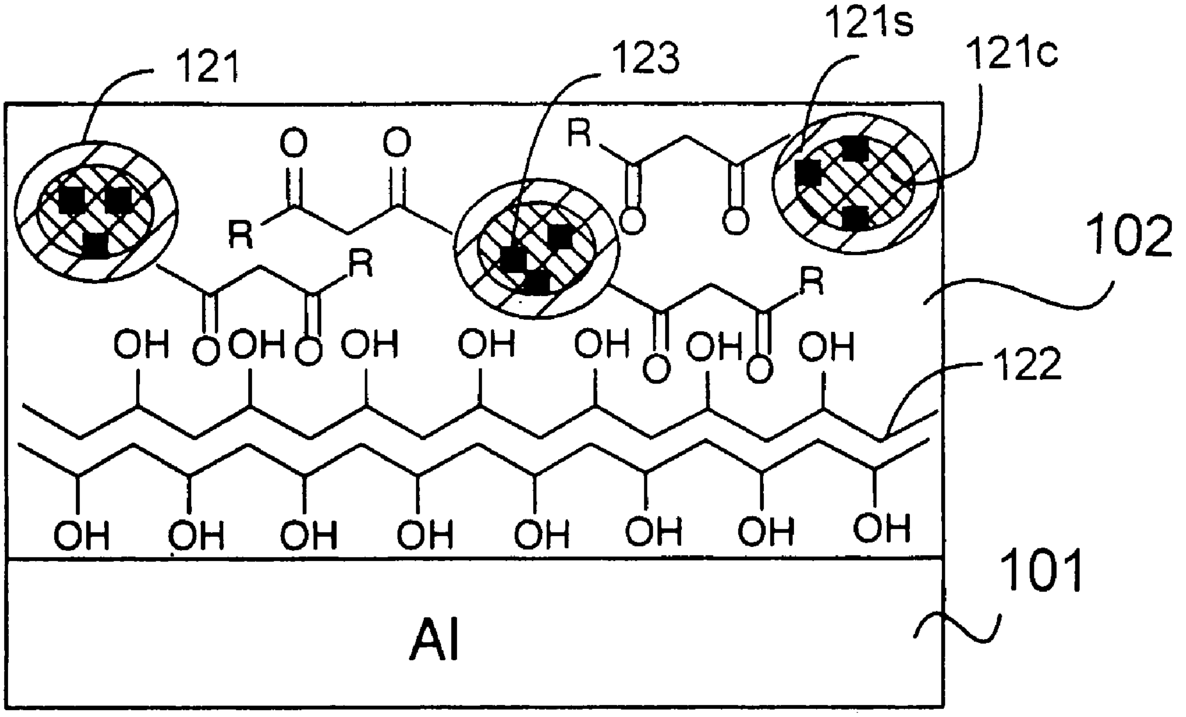
FIG. 4 is a sectional view schematically illustrating a preserisitized lithographic plate of the second embodiment.

FIG. 4 is a sectional view schematically illustrating a presensitized lithographic plate of the second embodiment.

The presensitized lithographic plate shown in FIG. 4 comprises a hydrophilic support (101) and an image-forming layer (102).

The hydrophilic support (101) comprises an aluminum plate.

In the image-forming layer (102), microcapsules (121) are dispersed in a hydrophilic binder (122). Each of the microcapsules (121) comprises a core (121*c*) and a shell (121*s*). In the core/shell structure of the microcapsule, the core (121*c*) comprises a polymerizable compound, and the shell (121*s*) comprises a polymer. In the presensitized lithographic plate shown in FIG. 4, the core further comprises an agent capable of converting light to heat. The hydrophilic binder (122) has a nonionic hydrophilic group (—OH), and the polymer of the shell (121*s*) has a group (—CO—$CH_2$—CO—R) having a function of forming an aluminum complex.

The hydrophilic binder (122) essentially separates the functional group (—CO—$CH_2$—CO—R) of the shell (121*s*) from the aluminum support (101). Accordingly, a complex is scarcely formed between the functional group of the shell polymer and aluminum of the support before processing the presensitized plate.

In the second embodiment, the shell polymer has a group having a function of forming an aluminum complex. The formed aluminum complex has a constant of stability in terms of common logarithm at 25° C. preferably of not lower than 3, more preferably of not lower than 5, and most preferably of not lower than 8.

The stability constant of the aluminum complex is described in various documents, such as Gregory H. Robinson, Coordination Chemistry of Aluminum, USA, VCH Publishers, Inc. (1993), pages 89–103.

Each of the compounds described in the documents has a relatively small molecular weight, while the shell polymer used in the present invention have a large molecular weight. In the present invention, a partial structure corresponding to the aluminum complex disclosed in the documents can be introduced into the shell polymer. In more detail, a monovalent or divalent group corresponding to an atomic group formed by removing one or two hydrogen atoms or hydroxyl groups from the disclosed compound can be added to a molecular structure of the shell polymer as a substituent group or a linking group.

The functional group is preferably placed on the surface of the microcapsule. Accordingly, the functional group is preferably attached to the side chain of the shell polymer rather than the main chain.

The group having a function of forming an aluminum complex preferably comprises two carbonyl groups between which one carbon atom intervenes, or preferably contains nitrogen atom having an unshared electron pair.

The functional group comprising two carbonyl groups between which one carbon atom intervenes is preferably represented by the following formula (IXX):

(IXX)

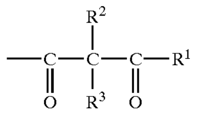

in which $R^1$ is an aliphatic group, an aromatic group, a heterocyclic group or —O—$R^4$, and $R^4$ is hydrogen or an aliphatic group. $R^1$ preferably is hydrogen or an aliphatic group. Each of $R^2$ and $R^3$ independently is hydrogen or an aliphatic group. Each of $R^2$ and $R^3$ preferably is hydrogen.

The aliphatic group, the aromatic group and the heterocyclic group are described about the first embodiment.

The nitrogen atom having an unshared electron pair is preferably contained in an amino group, a substituted amino group or an aromatic heterocyclic group. The substituent group of the substituted amino group preferably is an aliphatic group or an aromatic group, more preferably is an aliphatic group, and most preferably is an alkyl group or a substituted alkyl group.

The nitrogen atom having an unshared electron pair is more preferably contained in an aromatic heterocyclic group. Examples of the aromatic heterocyclic ring (monocyclic ring) containing nitrogen atom having an unshared electron pair include pyrrole ring, pyridine ring, pyrazole ring, imidazole ring, triazole ring, tetrazole ring, isoxazole ring, oxazole ring, isothiazole ring, thiazole ring, thiadiazole ring, pyridazine ring, pyrimidine ring, pyrazine ring and triazine ring.

An aromatic hydrocarbon ring, another heterocyclic ring or an aliphatic ring can be condensed with the aromatic heterocyclic ring. Examples of the condensed rings include indole ring, carbazole ring, azaindole ring, indazole ring, benzimidazole ring, benzotriazole ring, benzisoxazole ring, benzoxazole ring, benzothiazole ring, purine ring, quinoline ring, isoquinoline ring, acridine ring, phthalazine ring, quinazoline ring, quinoxaline ring naphthylidine ring phenanthroline ring pteridine ring.

The aromatic heterocyclic ring and the condensed ring can have a substituent group. Examples of the substituent groups are the same as the examples of the substituent groups of the aromatic group described about the first embodiment.

The functional group containing the nitrogen atom having an unshared electron pair preferably is a monovalent group corresponding to an atomic group formed by removing one hydrogen atom attached to carbon atom from the aromatic heterocyclic ring or a condensed ring thereof.

The main chain of the shell polymer preferably is a polymer of condensation polymerization rather than a polymer of addition polymerization. The main chain more preferably is polyurethane, polyurea, polyester, polyamide, a copolymer thereof or a mixture thereof, and most preferably is polyurethane, polyurea, a copolymer thereof or a mixture thereof.

The polyurethane has an urethane bond (—NH—CO—O—) in its main chain, the polyurea has an urea bond (—NH—CO—NH—) in its main chain, the polyester has an ester bond (—CO—O—) in its main chain, the polyamide has an amido bond (—CO—NH—) in its main chain, and the copolymer has two or more kinds of those bonds in its main chain.

The polyurethane, the polyurea and the copolymer thereof can be synthesized by a reaction of a polyisocyanate with a polyol or polyamine. The polyurethane, the polyurea and the copolymer thereof can also be synthesized by a condensation reaction of a polyisocyanate with a polyamine obtained by hydrolysis of polyisocyanate. The shell polymer of microcapsules is preferably prepared by the steps of: reacting 1 mole of an n-valent polyol with n mole of a polyisocyanate to synthesize adduct as an intermediate; and reacting the adduct to obtain the shell polymer. In a practical procedure, the multivalent isocyanate in excess (more than n mole) of the polyol is usually added to the reaction system. Further, in some cases, the polyisocyanate is reacted with not only the polyol but also a nucleophilic compound (e.g., alcohol, phenol, thiol, amine) having a nucleophilic group (e.g., hydroxyl, mercapto, amino). In other cases, the adduct of the polyol with the polyisocyanate can be reacted and partly modified with the nucleophilic compound to prepare the shell polymer. The alcohol can be in the form of a polymer having hydroxyl at the terminal (a polymer having a functional group and hydroxyl if the functional group is introduced into the polymer).

The shell polymer is most preferably prepared by the steps of: introducing the functional group (the group having a function of forming an aluminum complex) into the polyol or the nucleophilic compound used with the polyol (not into the polyisocyanate); reacting the functional compound with the multivalent isocyanate to synthesize an isocyanate adduct; and reacting the adduct to prepare the shell polymer.

The functional compound used in the synthesis of the shell polymer is preferably represented by the following formula (XX):

$$L^1Fu_mZ_n \qquad (XX)$$

in which $L^1$ is a (m+n)-valent linking group; each of m and n independently is an integer of 1 to 100; Fu is a group having a function of forming an aluminum complex; and Z is a nucleophilic group.

The linking group $L^1$ preferably is an aliphatic group having two or more valences, an aromatic group having two or more valences, a heterocyclic group having two or more valences, —O—, —S—, —NH—, —N<, —CO—, —SO—, —$SO_2$— or a combination thereof.

Each of m and n preferably is an integer of 1 to 50, more preferably is an integer of 1 to 20, further preferably is an integer of 1 to 10, and most preferably is an integer of 1 to 5.

The group of Z preferably is OH, SH or $NH_2$, more preferably is OH or $NH_2$, and most preferably is OH.

The functional compound is more preferably an alcohol, phenol or polyol represented by the following formula (XXI):

$$L^2Fu_m(OH)_n \qquad (XXI)$$

in which $L^2$ is a (m+n)-valent linking group; each of m and n is independently an integer of 1 to 50; and Fu is a group comprising two carbonyl groups between which one carbon atom intervenes, or a group containing nitrogen atom having an unshared electron pair.

Two or more functional compounds (having a function of forming an aluminum complex) can be used in combination.

The functional compound can be used in combination with another polyol to prepare adduct with a polyisocyanate. Further, adduct of a functional compound with a polyisocyanate can be used in combination with another adduct of another polyol with a polyisocyanate. Furthermore, adduct of another polyol with a polyisocyanate can be reacted with a functional compound to prepare (modified) adduct containing the functional group.

The polyol used together with the functional compound preferably is a polyol having three or more functional groups, and more preferably is a compound represented by the formula (XII) described in the first embodiment.

A polyamine can be used to form the shell polymer in addition to the functional compound or polyol. The polyamine preferably is water-soluble. Examples of the polyamines include ethylenediamine, phenylenediamine, diethylenetriamine, triethylenetetramine and tetraethylenepentamine.

The polyisocyanate preferably is a diisocyanate represented by the formula (XIII) described in the first embodiment.

As is described above, the shell polymer is preferably prepared by the steps of: reacting the polyol with a polyisocyanate to synthesize adduct as an intermediate (or prepolymer), and then reacting the adduct to obtain the shell polymer.

In the synthesis reaction of the adduct, the mass ratio of polyol/isocyanate is preferably in the range of 1/100 to 80/100, and more preferably in the range of 5/100 to 50/100.

The polyol can be reacted with the polyisocyanate by heating them in an organic solvent. In the case where no catalyst is used, they are heated preferably at 50° C. to 100° C. If a catalyst is used, the reaction can proceed at a relatively low temperature (40 to 70° C.). Examples of the catalyst include tin(II) octylate and dibutyltin diacetate.

The organic solvent preferably contains no active hydrogen. Namely, alcohols, phenols and amines are not preferred. Examples of the organic solvent include an ester (e.g., ethyl acetate), a halogenated hydrocarbon (e.g., chloroform), an ether (e.g., tetrahydrofuran), a ketone (e.g., acetone), a nitrile (e.g., acetonitrile) and a hydrocarbon (e.g., toluene).

[Shell Polymer of Third Embodiment]

The shell polymer of the third embodiment is a polymer having a lactone ring. The lactone ring is a heterocyclic ring containing an atomic group corresponding to an ester bond (—CO—O—), namely is a cyclic ester. There is no specific limitation with respect to the ring other than the ester bond (—CO—O—). The lactone ring can have an unsaturated bond, a condensed ring (an aliphatic ring, an aromatic ring, a heterocyclic ring), a substituent group (e.g., an aliphatic group, an aromatic group, a heterocyclic group) or a hetero atom (e.g., oxygen, nitrogen, sulfur) in addition to the ester bond.

The lactone ring is preferably a five-membered ring (γ-lactone) or a six-membered ring (δ-lactone).

The aliphatic group, the aromatic group and the heterocyclic group are described about the first embodiment.

The lactone ring is preferably placed on the surface of the microcapsule. Accordingly, the lactone ring is preferably attached to the side chain of the shell polymer rather than the main chain.

The main chain of the shell polymer preferably is a polymer of condensation polymerization rather than a polymer of addition polymerization. The main chain more preferably is polyurethane, polyurea, polyester, polyamide, a copolymer thereof or a mixture thereof, and most preferably is polyurethane, polyurea, a copolymer thereof or a mixture thereof.

The polyurethane has an urethane bond (—NH—CO—O—) in its main chain, the polyurea has an urea bond (—NH—CO—NH—) in its main chain, the polyester has an ester bond (—CO—O—) in its main chain, the polyamide has an amido bond (—CO—NH—) in its main chain, and the copolymer has two or more kinds of those bonds in its main chain.

The polyurethane, the polyurea and the copolymer thereof can be synthesized by a reaction of a polyisocyanate with a polyol or polyamine. The polyurethane, the polyurea and the copolymer thereof can also be synthesized by a condensation reaction of a polyisocyanate with a polyamine obtained by hydrolysis of polyisocyanate. The shell polymer of microcapsules is preferably prepared by the steps of: reacting 1 mole of an n-valent polyol with n mole of a polyisocyanate to synthesize adduct as an intermediate; and reacting the adduct to obtain the shell polymer. In a practical procedure, the multivalent isocyanate in excess (more than n mole) of the polyol is usually added to the reaction system. Further, in some cases, the polyisocyanate is reacted with not only the polyol but also a nucleophilic compound (e.g., alcohol, phenol, thiol, amine) having a nucleophilic group (e.g., hydroxyl, mercapto, amino). In other cases, the adduct of the polyol with the polyisocyanate can be reacted and partly modified with the nucleophilic compound to prepare the shell polymer. The alcohol can be in the form of a polymer having hydroxyl at the terminal (a polymer having a lactone ring and hydroxyl if the lactone ring is introduced into the polymer).

The shell polymer is most preferably prepared by the steps of: introducing the lactone ring into the polyol or the nucleophilic compound used with the polyol (not into the polyisocyanate); reacting the lactone compound with the multivalent isocyanate to synthesize an isocyanate adduct; and reacting the adduct to prepare the shell polymer.

The lactone compound used in the synthesis of the shell polymer is preferably represented by the following formula (XXII):

$$L^1Lc_mZ_n \quad \text{(XXII)}$$

in which $L^1$ is a (m+n)-valent linking group; each of m and n independently is an integer of 1 to 100; Lc is a monovalent group comprising a lactone ring; and Z is a nucleophilic group.

The linking group $L^1$ is preferably an aliphatic group having two or more valences, an aromatic group having two or more valences, a heterocyclic group having two or more valences, —O—, —S—, —NH—, —N<, —CO—, —SO—, —$SO_2$— or a combination thereof.

Each of m and n preferably is an integer of preferably 1 to 50, more preferably is an integer of 1 to 20, further preferably is an integer of 1 to 10, and most preferably is an integer of 1 to 5.

The group of Lc preferably is a monovalent group comprising a γ-lactone ring or a δ-lactone ring.

The group of Z preferably is OH, SH or $NH_2$, more preferably is OH or $NH_2$, and most preferably is OH.

The lactone compound is more preferably an alcohol, phenol or polyol represented by the following formula (XXIII):

$$L^2Lc_m(OH)_n \quad \text{(XXIII)}$$

in which $L^2$ is a (m+n)-valent linking group; each of m and n is independently an integer of 1 to 50; and Lc is a monovalent group comprising a lactone ring.

Examples of the lactone compound are shown below.

(1)

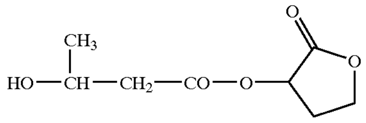

(2)

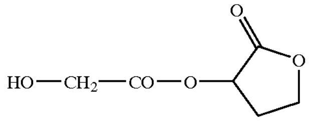

(3)

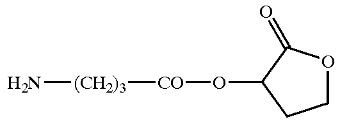

(4)

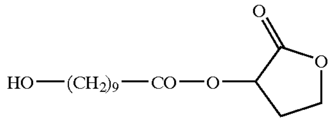

(5)

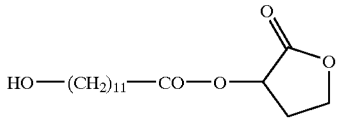

(6)

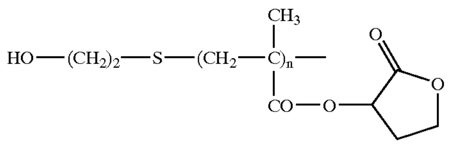

n: integer of 1 to 100

(7)

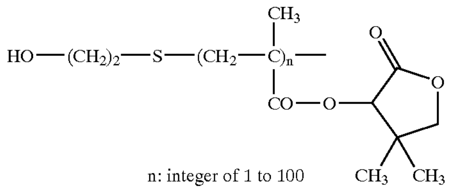

n: integer of 1 to 100

-continued (8)

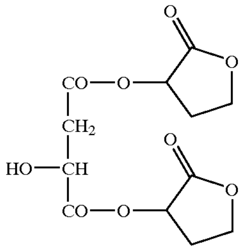

(9)

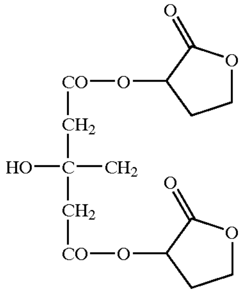

(10)

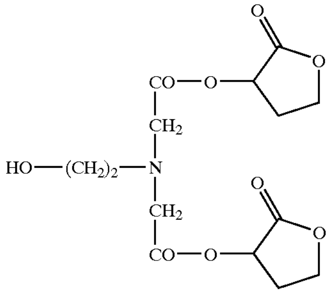

(11)

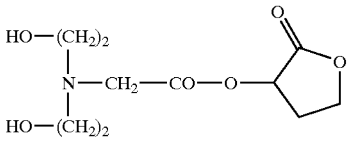

(12)

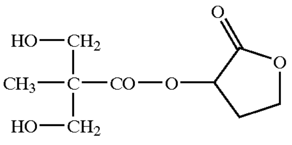

(13)

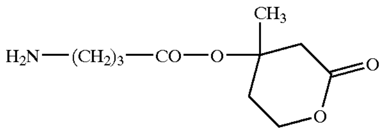

(14)

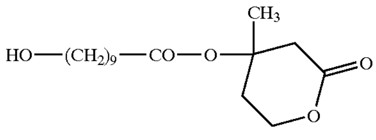

-continued (15)

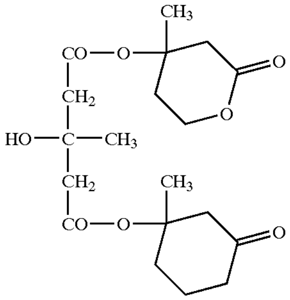

Two or more lactone compounds can be used in combination.

The lactone compound can be used in combination with another polyol to prepare adduct with a polyisocyanate. Further, adduct of a lactone compound with a polyisocyanate can be used in combination with another adduct of another polyol with a polyisocyanate. Furthermore, adduct of another polyol with a polyisocyanate can be reacted with a lactone compound to prepare (modified) adduct containing the lactone ring.

The polyol used together with the lactone compound preferably is a polyol having three or more functional groups, and more preferably is a compound represented by the formula (XII) described in the first embodiment.

A polyamine can be used to form the shell polymer in addition to the lactone compound or polyol. The polyamine preferably is water-soluble. Examples of the polyamines include ethylenediamine, phenylenediamine, diethylenetriamine, triethylenetetramine and tetraethylenepentamine.

The polyisocyanate preferably is a diisocyanate represented by the formula (XIII) described in the first embodiment.

As is described above, the shell polymer is preferably prepared by the steps of: reacting the polyol with a polyisocyanate to synthesize adduct as an intermediate (or prepolymer), and then reacting the adduct to obtain the shell polymer.

In the synthesis reaction of the adduct, the mass ratio of polyol/isocyanate is preferably in the range of 1/100 to 80/100, and more preferably in the range of 5/100 to 50/100.

The polyol can be reacted with the polyisocyanate by heating them in an organic solvent. In the case where no catalyst is used, they are heated preferably at 50° C. to 100° C. If a catalyst is used, the reaction can proceed at a relatively low temperature (40 to 70° C.). Examples of the catalyst include tin(II) octylate and dibutyltin diacetate.

The organic solvent preferably contains no active hydrogen. Namely, alcohols, phenols and amines are not preferred. Examples of the organic solvent include an ester (e.g., ethyl acetate), a halogenated hydrocarbon (e.g., chloroform), an ether (e.g., tetrahydrofuran), a ketone (e.g., acetone), a nitrile (e.g., acetonitrile) and a hydrocarbon (e.g., toluene).

[Core of Microcapsules]

A core of microcapsules comprises a polymerizable compound. The polymerizable compound can be in the form of a polymer, which is a cross-linkable polymer having a polymerizable group as a cross-likable functional group.

The polymerizable compound preferably has two or more polymerizable functional groups.

The polymerizable functional group can be reacted by heat to be polymerized. A heat-sensitive precursor of accelerating the polymerization reaction (e.g., acid) can be used in combination with a polymerizable compound (e.g., a vinyl ether or a cyclic ether). Further, a thermal polymerization initiator (a radical precursor) can be used in combination with a polymerizable compound (ethylenically unsaturated polymerizable compound).

The combination of the heat-sensitive acid precursor and the vinyl ether or the cyclic ether is described in Japanese Patent Provisional Publication No. 2001-277740, 2002-46361 and 2002-29162.

The combination of the thermal polymerization initiator (the radical precursor) and the ethylenically unsaturated polymerizable compound is described in Japanese Patent Provisional Publication No. 2002-137562.

The cyclic ether preferably is a compound having a three-membered epoxy group. The compound preferably has two or more cyclic ether groups. A commercially available epoxy compound or epoxy resin can be used as the polymerizable compound.

The vinyl ether preferably has two or more vinyl ether groups. The vinyl ether is preferably represented by the formula (XXIV):

$$L^5(—O—CR^1{=}CR^2R^3)_p \qquad \text{(XXIV)}$$

in which $L^5$ is a p-valent linking group, and p is an integer of 2 or more. Each of $R^1$, $R^2$ and $R^3$ independently is hydrogen, a halogen atom, an alkyl group or an aryl group.

In the case that p is 2, $L^5$ preferably is a divalent linking group selected from the group consisting of an alkylene group, a substituted alkylene group, an arylene group, a substituted arylene group, a divalent heterocyclic group, —O—, —S—, —NH—, —CO—, —SO—, —$SO_2$— and a combination thereof.

The alkylene group and the alkylene moiety of the substituted alkylene group can have a cyclic or branched structure. The alkylene group and the alkylene moiety of the substituted alkylene group preferably have 1 to 20 carbon atoms, more preferably has 1 to 15 carbon atoms, further preferably has 1 to 10 carbon atoms, and most preferably has 1 to 8 carbon atoms.

Examples of the substituent groups of the substituted alkylene group include a halogen atom, an aryl group, a substituted aryl group and an alkoxy group.

The arylene group and the arylene moiety of the substituted arylene group preferably is phenylene, and more preferably is p-phenylene.

The divalent heterocyclic group can have a substituent group.

Examples of the substituent groups of the substituted arylene group, the substituted aryl group and the substituted heterocyclic group include a halogen atom, an alkyl group, a substituted alkyl group, an aryl group, a substituted aryl group and an alkoxy group.

Examples of the substituent groups of the substituted alkyl group are the same as the examples of the substituent groups of the substituted alkylene group.

In the case the p is 3 or more, $L^5$ preferably is a trivalent or more aliphatic group, a trivalent or more aromatic group, a trivalent or more heterocyclic group, or a combination of a trivalent or more aliphatic group, a trivalent or more aromatic group or a trivalent or more heterocyclic group with an alkylene group, a substituted alkylene group, an arylene group, a substituted arylene group, a divalent heterocyclic group, —O—, —S—, —NH—, —CO—, —SO— or —$SO_2$—.

The trivalent or more aliphatic group can have a cyclic or branched structure. The aliphatic preferably has 1 to 20 carbon atoms, more preferably has 1 to 15 carbon atoms, further preferably has 1 to 10 carbon atoms, and most preferably has 1 to 8 carbon atoms.

The aliphatic group can have a substituent group. Examples of the substituent groups include a halogen atom, an aryl group, a substituted aryl group and an alkoxy group.

The aromatic group preferably is a residue (a radical) of benzene ring. The aromatic group can have a substituent group. Examples of the substituent groups include a halogen atom, an alkyl group, a substituted alkyl group, an aryl group, a substituted aryl group and an alkoxy group.

The heterocyclic group can have a substituent group. Examples of the substituent groups include a halogen atom, an alkyl group, a substituted alkyl group, an aryl group, a substituted aryl group and an alkoxy group.

$L^5$ can form a main chain of a polymer comprising repeating units, in which p is a number of the repeating units.

Each of $R^1$, $R^2$ and $R^3$ preferably is hydrogen, a halogen atom or an alkyl group, more preferably is hydrogen, a halogen atom or an alkyl group having 1 to 6 carbon atoms, further preferably is hydrogen or an alkyl group having 1 to 3 carbon atoms, furthermore preferably is hydrogen or methyl, and most preferably is hydrogen.

The ethylenically unsaturated polymerizable compound preferably has two or more ethylenically unsaturated groups. The ethylenically unsaturated polymerizable compound is preferably represented by the formula (XXV):

$$L^5(—CR^1{=}CR^2R^3)_p \qquad \text{(XXV)}$$

in which, $L^5$ is a p-valent linking group, and p is an integer of 2 or more. Each of $R^1$, $R^2$ and $R^3$ independently is hydrogen, a halogen atom, an alkyl group or an aryl group.

The definitions and examples of $L^5$, p, $R^1$, $R^2$ and $R^3$ are the same as $L^5$, p, $R^1$, $R^2$ and $R^3$ in the formula (XXIV).

The core of the microcapsules can comprise an agent of accelerating thermal polymerization (e.g., heat-sensitive acid precursor), a thermal polymerization initiator, an agent of converting light to heat in addition to the polymerizable compound.

[Thermal Polymerization Initiator]

In the case that the polymerizable compound has a radical polymerizable group such as ethylenically unsaturated group, the image-forming layer preferably contains a thermal polymerization initiator.

The thermal polymerization initiator generates radicals when receiving-thermal energy, and thereby starts and accelerates polymerization of the compound having polymerizable unsaturated groups. Examples of the thermal polymerization initiator include onium salts, triazine compounds having trihalomethyl groups, peroxides, azo compounds, azide compounds, quinonediazide compounds and metallocene compounds. Preferred are onium salts (e.g., diazonium salts, iodonium salts, sulfonium salts, ammonium salts, pyridinium salts), and particularly preferred are diazonium salts, iodonium salts and sulfonium salts.

Two or more thermal polymerization initiators may be used in combination.

Japanese Patent Publication No. 2002-137562 describes the thermal polymerization initiator (thermo-radical generator).

The thermal polymerization initiator is incorporated in the image-forming layer in an amount of preferably 0.1 to 50 wt. %, more preferably 0.5 to 30 wt. %, most preferably 1 to 20 wt. %, based on the total solid content of the image-forming layer.

The microcapsules may contain the thermal polymerization initiator. In that case, the initiator is preferably insoluble in water. If not contained in the microcapsules, the initiator is preferably soluble in water.

[Heat-sensitive Acid Precursor]

In the case that the polymerizable compound has a cationic polymerizable group such as vinyloxy or epoxy, the image-forming layer preferably also contains a heat-sensitive acid precursor.

The heat-sensitive acid precursor generates an acid when heated. The generated acid starts and accelerates polymerization reaction of the vinyloxy or epoxy group. The heat-sensitive acid precursor is preferably an onium salt.

Examples of the heat-sensitive acid precursor include diazonium salts (described in S. I. Schlesinger, Photogr. Sci. Eng., 18, 387(1974) and T. S. Bal et al, Polymer., 21, 423(1980)), ammonium salts (described in U.S. Pat. Nos. 4,069,055, 4,069,056, Reissue No. 27,992 and Japanese Patent Provisional Publication No. 4(1992)-365049), phosphonium salts (described in D. C. Necker et al, Macromolecules, 17, 2468(1984); C. S. Wen et al, Teh. Proc. Conf. Rad., Curing ASIA, pp. 478, Tokyo, October (1988); and U.S. Pat. Nos. 4,069,055, 4,069,056), iodonium salts (described in J. V. Crivello et al., Macro-molecules, 10(6), 1307(1977); Chem. & Eng. News, Nov.28, pp. 31(1988); European Patent No. 104,143; U.S. Pat. Nos. 339,049 and 410,201; Japanese Patent Provisional Publication Nos. 2(1990)-150848 and 2(1990)-296514), sulfonium salts (described in J. V. Crivello et al., Polymer J. 17, 73(1985); J. V. Crivello et al., J. Org. Chem., 43, 3055(1978); W. R. Watt et al., J. Polymer Sci., Polymer Chem. Ed., 22, 1789(1984); J. V. Crivello et al., Polymer Bull., 14, 279(1985); J. V. Crivello et al., Macromolecules, 14(5), 1141(1981); J. V. Crivello et al., J. Polymer Sci., Polymer Chem. Ed., 17, 2877(1979); European Patent Nos. 370,693, 3,902,114, 233, 567, 297,443, 297,442; U.S. Pat. Nos. 4,933,377, 161,811, 410,201, 339,049, 4,760,013, 4,734,444, 2,833,827; German Patent Nos. 2,904,626, 3,604,580 and 3,604,581), selenonium salts (described in J. V. Crivello et al., Macromolecules, 10(6), 1307(1977); and J. V. Crivello et al., J. Polymer Sci., Polymer Chem. Ed., 17, 1047(1979)), and arsonium salts (described in C. S. Wen et al, Teh. Proc. Conf. Rad., Curing ASIA, pp. 478, Tokyo, October (1988)).

Examples of counter ions for the onium salt include $BF_4^-$, $PF_6^-$, $AsF_6^-$ and $SbF_6^-$.

Two or more heat-sensitive acid precursors may be used in combination.

The heat-sensitive acid precursor is incorporated in the image-forming layer in an amount of preferably 0.01 to 20 wt. %, more preferably 0.1 to 10 wt. %, based on the total solid content of the image-forming layer.

[Hydrophobic Polymer]

In the case where the polymerizable compound is a monomer, a hydrophobic polymer can be used as a binder of the polymerizable compound. If the polymerizable compound is a polymer, the compound itself can also serve as the hydrophobic polymer.

As a main chain, the hydrophobic polymer preferably comprises a polymer moiety selected from the group consisting of hydrocarbon (polyolefin), polyester, poly-amide, polyimide, polyurea, polyurethane, polyether and a combination thereof. The main chain is more preferably hydrocarbon (polyolefin) or polyurethane.

The main chain of the hydrophobic polymer may have a substituent group. Examples of the substituent group include halogen atoms (F, Cl, Br, I), hydroxyl, mercapto, carboxyl, sulfo, sulfuric ester groups, phosphono, phosphoric ester groups, cyano, aliphatic groups, aromatic groups, heterocyclic groups, —O—R, —S—R, —CO—R, —NH—R, $—N(—R)_2$, $—N^+(—R)_3$, —CO—O—R, —O—CO—R, —CO—NH—R, —NH—CO—R and $—P(=O)(—O—R)_2$. In the above, R is an aliphatic group, an aromatic group or a heterocyclic group. Further, carboxyl, sulfo, sulfuric ester groups, phosphono and phosphoric ester groups in the above may be either in the dissociated form or in the form of salt.

Two or more substituent groups of the main chain may connect with each other to form an aliphatic or heterocyclic ring, which may form a spiro linkage with the main chain. The formed ring may have a substituent group. Examples of the substituent group include oxo (=O) and the substituent groups described above.

The hydrophobic polymer has a weight average molecular weight of preferably 500 to 1,000,000, more preferably 1,000 to 500,000, further preferably 2,000 to 200,000, most preferably 5,000 to 100,000.

In the case where the hydrophobic polymer is used in addition to the polymerizable compound, the polymer is incorporated in the image-forming layer in an amount of preferably 5 to 90 wt. %, more preferably 30 to 80 wt. %.

[Preparation of Microcapsules]

The microcapsules can be prepared according to known methods. Examples of the methods include the coacervation method (described in U.S. Pat. Nos. 2,800,457 and 2,800, 458), the interfacial polymerization method (described in U.K. Patent No. 990,443, U.S. Pat. No. 3,287,154, Japanese Patent Publication Nos. 38(1963)-19574, 42(1967)-446 and 42(1967)-711), the polymer deposition method (described in U.S. Pat. Nos. 3,418,250 and 3,660,304), the isocyanate-polyol wall-formation method (described in U.S. Pat. No. 3,796,669), the isocyanate wall-formation method (described in U.S. Pat. No. 3,914,511), the urea formaldehyde wall or urea formaldehyde-resorcinol wall-formation method (described in U.S. Pat. Nos. 4,001,140, 4,087,376, 4,089,802), the melamine-formaldehyde wall or hydroxycellulose wall-formation method (described in U.S. Pat. No. 4,025,445), the monomer polymerization-in situ method (described in Japanese Patent Publication Nos. 36(1961)-9163 and 51(1976)-9079), the spray-drying method (described in U.K. Patent No. 930,422, U.S. Pat. No. 3,111, 407), and the electrolytic dispersion cooling method (described in U.K. Patent Nos. 952,807 and 967,074).

The microcapsules have a mean particle size of preferably 0.01 to 20 μm, more preferably 0.05 to 2.0 μm, and most preferably 0.10 to 1.0 μm.

Two or more kinds of microcapsules may be used in combination.

The image-forming layer contains the microcapsules in an amount of preferably 10 to 95 wt. %, more preferably 15 to 90 wt. % in terms of solid content.

[Hydrophilic Compound]

The hydrophilic compound separates the shell polymer of microcapsules from the hydrophilic surface of the hydrophilic support.

As the hydrophilic compound, a hydrophilic polymer can be used. The hydrophilic polymer can also serve as a binder of the microcapsules.

The hydrophilic polymer preferably has a nonionic hydrophilic group, which is more preferably hydroxyl or polyether, most preferably hydroxyl. An alcoholic hydroxyl group is preferred to a phenolic one. Besides the nonionic hydrophilic group, the hydrophilic polymer may have other hydrophilic groups (e.g., cationic or anionic ones).

Various natural, semi-synthesized and synthesized hydrophilic polymers are usable.

Examples of the natural and semi-synthesized hydrophilic polymers include polysaccharides (e.g., gum arabi, starch derivatives, carboxymethylcellulose, sodium salt thereof, cellulose acetate, sodium alginate) and proteins (e.g., casein, gelatin).

Examples of the synthesized polymers having hydroxyl as the hydrophilic group include polyhydroxyethylmethacrylate, polyhydroxyethylacrylate, polyhydroxypropylmethacrylate, polyhydroxypropylacrylate, polyhydroxybutylmethacrylate, polyhydroxybutylacrylate, polyallyl alcohol, polyvinyl alcohol and poly-N-methylolacryl amide.

Examples of the synthesized polymers having polyether as the hydrophilic group include polyethylene glycol and polypropylene glycol.

A copolymer comprising two or more kinds of repeating units of hydrophilic synthesized polymers may be used. Also, a copolymer comprising repeating units of hydrophilic synthesized polymers and ones of hydrophobic polymers (e.g., polyvinyl acetate, polystyrene) may be used. Examples of the copolymer include vinyl alcohol-vinyl acetate copolymer (partly saponified polyvinyl alcohol). In the case where polyvinyl alcohol is partly saponified to synthesize the vinyl alcohol-vinyl acetate copolymer, the saponification degree is preferably 60% or more, more preferably 80% or more.

Two or more hydrophilic polymers can be used in combination.

In place of or in addition to the hydrophilic polymer, a hydrophilic compound of low molecular weight (which is not a polymer) may be used. Like the hydrophilic polymer, the hydrophilic compound preferably has a nonionic hydrophilic group, which is more preferably hydroxyl or polyether. Besides the nonionic hydrophilic group, the hydrophilic compound may have other hydrophilic groups (e.g., cationic or anionic ones).

As the hydrophilic compound of low molecular weight, nonionic surface-active agents (described in Japanese Patent Provisional Publication Nos. 62(1987)-251740 and 3(1991)-208514) are particularly preferred.

The image-forming layer contains the hydrophilic compound in an amount of preferably 2 to 40 wt. %, more preferably 3 to 30 wt. %.

[Agent Capable of Converting Light to Heat]

The image-forming layer or an optionally formed layer preferably contains an agent capable of converting light to heat. The agent capable of converting light to heat is preferably contained in the image-forming layer, and more preferably contained in microcapsules.

The converting agent absorbs light and converts the energy of light into thermal energy to generate heat.

The agent preferably absorbs light having the maximum absorption in the wavelength region of 700 nm or longer (infrared light). An infrared absorbing pigment, an infrared absorbing dye and metal fine particles are preferably used as the converting agent.

The infrared absorbing pigments are described in "Handbook of Color Index (CI)", "Latest Handbook of pigments (written in Japanese)", 1977, edited by Japan Association of Pigment Technology, "Latest Application Technology of Pigment (written in Japanese)", 1986, published by CMC, and "Technology of Printing Ink (written in Japanese)", 1984, published by CMC.

Carbon black is the most preferred infrared absorbing pigment.

In the case where the infrared absorbing pigment is contained in microcapsules, the pigment can be subjected to a hydrophobic (oleophilic) treatment. For example, a surface of the pigment can be coated with an oleophilic resin.

In the case where the infrared absorbing pigment is dispersed in a hydrophilic polymer, the pigment can be subjected to a hydrophilic treatment. For example, a surface of the pigment can be coated with a hydrophilic resin. A surface active agent can be adsorbed onto the pigment surface to form a hydrophilic surface. A reactive hydrophilic substance (e.g., silica sol, alumina sol, a silane coupling agent, an epoxy compounds, an isocyanate compound) can be combined with the pigment to form a hydrophilic surface.

The pigment has a particle size preferably in the range of 0.01 to 1 $\mu$m, and more preferably in the range of 0.01 to 0.5 $\mu$m.

The pigment particles can be dispersed in the hydrophilic polymer according to a conventional dispersing method for producing printing ink or toner.

The infrared absorbing dyes are described in "Handbook of Dyes (written in Japanese)", 1970, edited by Association of Organic Synthetic Chemistry, "Chemical Industry (written in Japanese)", May 1986, pp.45–51, the article titled "Near Infrared Absorbing Dyes", and "Development and Market of functional dyes in 1990", 1990, Chapter 2, Sections 2 and 3, published by CMC.

Examples of the infrared absorbing dyes include azo dyes, metal complex salt azo dyes, pyrazolone azo dyes, naphthoquinone dyes (described in Japanese Patent Provisional Publication Nos. 58(1983)-112793, 58(1983)-224793, 59(1984)-48187, 59(1984)-73996, 60(1985)-52940 and 60(1985)-63744), anthraquinone dyes, phthalocyanine dyes (described in Japanese Patent Provisional Publication No. 11(1999)-235883), squarilium dyes (described in Japanese Patent Provisional Publication No. 58(1983)-112792), pyrylium dyes (U.S. Pat. Nos. 3,881,924, 4,283,475, Japanese Patent Provisional Publication Nos. 57(1982)-142645, 58(1983)-181051, 58(1983)-220143, 59(1984)-41363, 59(1984)-84248, 59(1984)-84249, 59(1984)-146063, 59(1984)-146061, Japanese Patent Publication Nos. 5(1993)-13514 and 5(1993)-19702), carbonium dyes, quinoneimine dyes and methine dyes (described in Japanese Patent Provisional Publication Nos. 58(1983)-173696, 58(1983)-181690 and 58(1983)-194595).

The infrared absorbing dye is also described in U.S. Pat. Nos. 4,756,993, 5,156,938 and Japanese Patent Provisional Publication No. 10(1998)-268512.

The commercially available infrared absorbing dyes (e.g., Epolight III-178, III-130, III-125, EPOLINE) can also be used in the present invention.

Methine dyes are preferred. Cyanine dyes (described in British Patent No. 434,875, U.S. Pat. No. 4,973,572, Japanese Patent Provisional Publication Nos. 58(1983)-125246, 59(1984)-84356, 59(1984)-216146 and 60(1985)-78787) are more preferred. The cyanine dye is defined by the following formula.

(Cyanine Dye)

Bo-Lo=Bs

In the formula, Bs is a basic nucleus, Bo is an onium form of a basic nucleus, and Lo is a methine chain consisting of an odd number of methines. In the infrared absorbing methine dye, Lo preferably is a methine chain consisting of seven methines.

A hydrophilic dye is preferably used in the case where the infrared absorbing dye is added in a hydrophilic polymer of an image-forming layer. A relatively hydrophobic dye is preferably used in the case where the infrared absorbing dye is incorporated into microcapsules.

Metals generally have self-exothermic property. Accordingly, metals absorbing infrared, visible or ultraviolet (particularly, infrared) light is capable of converting light to heat.

The metal used in the form of fine particles is preferably melted and agglomerated by heat. The metal preferably has a melting point of 1,000° C. or below.

Examples of the metals forming the fine particles include Si, Al, Ti, V, Cr, Mn, Fe, Co, Ni, Cu, Zn, Y, Zr, Mo, Ag, Au, Pt, Pd, Rh, In, Sn, W, Te, Pb, Ge, Re, Sb and alloys thereof. Re, Sb, Te, Ag, Au, Cu, Ge, Pb and Sn are preferred, Ag, Au, Cu, Sb, Ge and Pb are more preferred, and Ag, Au and Cu are most preferred.

Alloys of metals can comprise a metal having low melting point (e.g., Re, Sb, Te, Au, Ag, Cu, Ge, Pb, Sn) and a highly self-exothermic metal (e.g., Ti, Cr, Fe, Co, Ni, W, Ge). Fine particles of metals highly absorbing light (e.g., Ag, Pt, Pb) can be used in combination with fine particles of other metals.

The metal fine particles are preferably subjected to a hydrophilic surface treatment, and dispersed in a hydrophilic polymer. Examples of the hydrophilic surface treatments include a surface treatment with hydrophilic material (e.g., surface active agent), a surface chemical reaction with hydrophilic material and a formation of (protective colloidal) hydrophilic polymer coating film. The surface chemical reaction with hydrophilic material is preferred, and a surface silicate treatment is most preferred. In the surface silicate treatment for iron fine particles, the particles are immersed in 3 wt. % aqueous solution of sodium silicate at 70° C. for 30 seconds to form a hydrophilic surface on the particles. The fine particles of other metals can also be subjected to the surface silicate treatment in a similar manner.

Fine particles of metal oxides or metal sulfides can be used in place of the metal fine particles.

The fine particles have sizes preferably of not more than 10 $\mu$m, more preferably in the range of 0.003 to 5 $\mu$m, and most preferably in the range of 0.01 to 3 $\mu$m.

The image-forming layer contains the agent capable of converting light to heat in an amount of preferably 5 to 50 wt. %, more preferably 7 to 40 wt. %, and most preferably 10 to 30 wt. %.

[Other Optional Components in Image-forming Layer]

The image-forming layer may contain a colorant, by which the imaging and non-imaging areas can be easily distinguished from each other after the image is formed. The colorant is a dye or pigment having a large absorption band in the visible region. Examples of the colorant include Oil Yellow #101, Oil Yellow #103, Oil Pink #312, Oil Green BG, Oil Blue BOS, Oil Blue #603, Oil Black BY, Oil Black BS and Oil Black T-505 (from Orient Chemical Industries Co., ltd); Victoria Pure Blue, Crystal Violet (CI42555), Methyl Violet (CI42535), Ethyl Violet, Rhodamine B (CI145170B), Malachite Green (CI42000) and Methylene Blue (CI52015). Dyes usable as the colorant are described in Japanese Patent Provisional Publication No. 62(1987)-293247. Further, inorganic pigments such as titanium oxide can be also used as the colorant.

The amount of the colorant is preferably in the range of 0.01 to 10 wt. % based on the weight of the image-forming layer.

Inorganic fine particles may be added in the image-forming layer. The fine particles are preferably made of oxides (e.g., silica, alumina, magnesium oxide, titanium dioxide) or metal salts (e.g., magnesium carbonate, calcium alginate).

The mean particle size of the inorganic fine particles is in the range of preferably 5 nm to 10 $\mu$m, more preferably 10 nm to 1 $\mu$m.

The image-forming layer contains the inorganic fine particles in an amount of preferably 1.0 to 70 wt. %, more preferably 5.0 to 50 wt. %.

The image-forming layer may further contain a nonionic surface-active agent (described in Japanese Patent Provisional Publication Nos. 62(1987)-251740 and 3(1991)-208514), an anionic surface-active agent, a cationic surface-active agent (described in Japanese Patent Provisional Publication No. 2(1990)-195356), an amphoteric surface-active agent (described in Japanese Patent Provisional Publication Nos. 59(1984)-121044 and 4(1992)-13149) or a fluorine-containing surface-active agent.

The amount of the surface-active agent is in the range of preferably 0.05 to 15 wt. %, more preferably 0.1 to 5 wt. % based on the weight of the image-forming layer.

In order to make the image-forming layer flexible, a plasticizer may be added. Examples of the plasticizer include polyethylene glycol, tributyl citrate, diethyl phthalate, dibutyl phthalate, dihexyl phthalate, dioctyl phthalate, tricredyl phosphate, tributyl phosphate, trioctyl phosphate, and tetrahydrofurfuryl oleate.

The image-forming layer contains the plasticizer in an amount of preferably 0.1 to 50 wt. %, more preferably 1 to 30 wt. %.

[Formation of Image-forming Layer]

The image-forming layer can be formed by the steps of: dissolving, dispersing or emulsifying the components including the microcapsules in an appropriate liquid medium to prepare a coating liquid; applying the liquid onto a support; and drying to remove the liquid medium. Examples of the liquid medium include ethylene dichloride, cyclohexane, methyl ethyl ketone, methanol, ethanol, propanol, ethyleneglycol monomethyl ether, 1-methoxy-2-propanol, 2-methoxyethyl acetate, 1-methoxy-2-propylacetate, dimethoxyethane, methyl lactate, ethyl lactate, N,N-dimethylacetamide, N,N-dimethylformamide, tetrametnylurea, N-methylpyrrolidone, dimethyl sulfoxide, sulfolane, γ-butyllactone, toluene and water. Two or more liquids may be mixed to use.

The solid content in the coating liquid is preferably in the range of 1 to 50 wt. %.

The coating liquid can contain a surface-active agent, so that it can be easily applied onto the support. As the surface-active agent, a fluorine-containing surface-active agent (described in Japanese Patent Provisional Publication No. 62(1987)-170950) is particularly preferred. The amount of the surface-active agent is in the range of preferably 0.01 to 1 wt. %, more preferably 0.05 to 0.5 wt. % based on the solid content of the coating liquid.

The coating liquid is preferably applied in an amount of 0.5 to 5.0 $g/m^2$ (under dried condition). The image-forming layer may be formed on an orientation layer.

[Hydrophilic Support]

The hydrophilic support can be made of metal, plastic or paper. Preferably, the support is a surface-treated aluminum plate, a hydrophilized plastic film or a water-proofed sheet of paper. In detail, an aluminum plate subjected to anodic oxidation, a polyethylene terephthalate film provided with a hydrophilic layer and a sheet of paper laminated with a polyethylene film are preferred.

The aluminum plate subjected to anodic oxidation is particularly preferred.

The aluminum plate is a plate of pure aluminum or an alloy plate comprising the main component of aluminum and a little amount of other metals. Examples of the metals other than aluminum include Si, Fe, Mn, Co, Mg, Cr, Zn, Bi, Ni and Ti. The amount of those metals is preferably 10 wt. % or less. A commercially available aluminum plate for printing plate may be used.

The aluminum plate has a thickness of preferably 0.05 to 0.6 mm, more preferably 0.1 to 0.4 mm, most preferably 0.15 to 0.3 mm.

The surface of the aluminum plate is preferably subjected to roughing treatment. The roughing treatment can be mechanically, electrochemically or chemically carried out. Examples of the mechanical roughing treatment include ball grinding, brush grinding, blast grinding and buff grinding. The electrochemical roughing treatment is, for example, a procedure in which direct or alternative current is applied to the plate in an electrolysis solution containing acid such as hydrochloric acid or nitric acid. The electrolytic roughing in a mixed acid (described in Japanese Patent Provisional Publication No. 54(1979)-63902) may be carried out. As the chemical roughing treatment, a procedure in which the aluminum plate is immersed in a saturated aqueous solution of aluminum salt with mineral acid (Japanese Patent Provisional Publication No. 54(1979)-31187) is preferred.

The roughing treatment is preferably carried out so that the aluminum plate may have a central surface roughness (Ra) in the range of 0.2 to 1.0 $\mu$m.

After the roughing treatment, the aluminum plate may be subjected to alkali etching treatment, if needed. As the alkali etching liquid, an aqueous solution of potassium hydroxide or sodium hydroxide is generally used. After the alkali etching treatment, a neutralizing treatment is preferably carried out.

The aluminum plate is preferably subjected to anodic oxidation treatment, so as to improve the abrasion resistance of the support.

Various electrolytes forming a porous oxide film can be used in the anodic oxidation treatment. Examples of the electrolyte include sulfuric acid, hydrochloric acid, oxalic acid, chromic acid, and mixtures thereof.

The anodic oxidation treatment is generally carried out under the following conditions: the concentration of the electrolytic solution is in the range of 1 to 80 wt. %, the temperature of the solution is in the range of 5 to 70° C., the electric current density is in the range of 5 to 60 A/$dm^2$, the voltage is in the range of 1 to 100 V and the time for electrolysis is in the range of 10 seconds to 5 minutes.

The oxide film formed by the anodic oxidation has a thickness of preferably 1.0 to 5.0 g/$m^2$, more preferably 1.5 to 4.0 g/$m^2$.

The oxide film is preferably further subjected to silicate treatment, to form an anionic group-containing hydrophilic surface. U.S. Patent Publication Nos. 2,714,066, 3,181,461, 3,280,734 and 3,902,734 describe silicate treatment in which an aqueous solution of alkali metal silicate (e.g., sodium silicate) is used.

The concentration of alkaline metal silicate in the aqueous solution is in the range of preferably 0.1 to 30 wt. %, more preferably 0.5 to 15 wt. %. The pH value of the solution at 25° C. is preferably in the range of 10 to 13.5. The temperature of the solution is in the range of preferably 5 to 80° C., more preferably 10 to 70° C., further preferably 15 to 50° C. The silicate treatment is conducted for preferably 0.5 to 120 seconds. The anodic oxide film is preferably immersed in the solution, or otherwise the solution is preferably sprayed onto the film.

The alkali metal ion, which is a counter ion in the silicate, is preferably sodium, potassium or lithium. The pH value of the silicate aqueous solution is preferably controlled with hydroxide (e.g., sodium hydroxide, potassium hydroxide, lithium hydroxide). Salts of alkaline earth metals or IVb group metals may be added to the solution. In that case, the alkaline earth metal salt is preferably water-soluble. Examples of the alkaline earth metal salts include nitrates (e.g., calcium nitrate, strontium nitrate, magnesium nitrate, barium nitrate), sulfates, hydrochlorides, phosphates, acetates, oxalates and borates. Examples of the IVb group metal salts include titanium tetrachloride, titanium trichloride, titanium potassium fluoride, titanium potassium oxalate, titanium sulfate, titanium tetraiodide, and zirconium chloride oxide. Two or more salts of alkaline earth metals or IV group metals may be used in combination. The content of the alkaline earth metal or IVb group metal salts is in the range of preferably 0.01 to 10.0 wt. %, more preferably 0.05 to 5.0 wt. %.

[Water-soluble Overcoating Layer]

For protecting the surface of the image-forming layer from stain of oleophilic material, a water-soluble overcoating layer can be provided on the image-forming layer.

The water-soluble overcoating layer is made of material easily removable in printing, and hence is preferably formed from a water-soluble organic polymer. Examples of the water-soluble organic polymer include polyvinyl alcohol, polyvinyl acetate, polyacrylic acid, salts thereof with alkali metals and amines, poly-methacrylic acid, salts thereof with alkali metals and amines, polyacryl amide, polyhydroxyethylacrylate, polyvinyl pyrrolidone, polyvinyl methyl ether, poly-2-acrylamice-2-methyl-1-propanesulfonic acid, salts thereof with alkali metals and amines, gum arabic, cellulose ethers (e.g., carboxymethyl cellulose, carboxyethyl cellulose, methyl cellulose), dextrin and derivatives thereof (e.g., white dextrin, enzyme-decomposition-etherized dextrin pullulan).

A copolymer having two or more repeating units of water-soluble organic polymers-may be used. Examples of the copolymer include vinyl alcohol-vinyl acetate copolymer (partially saponified polyvinyl acetate) and vinyl methyl ether-maleic anhydride copolymer. In the case where the vinyl alcohol-vinyl acetate copolymer is prepared by partially saponifying polyvinyl acetate, the saponification degree is preferably 65 wt. % or more.

Two or more water-soluble organic polymers can be used in combination.

The overcoating layer may contain the aforementioned light-to-heat converting agent. In that case, the converting agent is preferably water-soluble.

A coating solution for forming the overcoating layer may contain a nonionic surface-active agent (e.g., polyoxyethylenenonylphenyl ether, polyoxyethylenedodecyl ether).

The coating solution is preferably applied in an amount of 0.1 to 2.0 g/$m^2$.

[Step of Imagewise Heating]

The presensitized lithographic printing plate is imagewise heated to form an image. For example, the presensitized plate can be imagewise heated by means of a thermal recording head. In that case, the light-to-heat converting agent is not necessary.

However, since the thermal recording head generally gives an image with low resolution, it is preferred to use the light-to-heat converting agent for converting energy of imagewise applied light into thermal energy. Generally, an image obtained by imagewise exposure has higher resolution than one by heating with a thermal recording head.

There are two ways to perform the imagewise exposure. One is exposure through an original image in the form of analog data, and the other is scanning exposure based on the original image data (usually, in the form of digital data).

In the former exposure (analog exposure), the light source is a xenon discharge lamp or an infrared lamp. If a high power lamp such as a xenon lamp is used as the light source, it is possible to perform flash exposure.

In the latter exposure (scanning exposure), a laser, particularly-an infrared laser is generally used. The infrared laser preferably emits rays in the wavelength region of 700 to 1,200 nm. The laser is preferably a high power solid IR laser (e.g., semiconductor laser, YAG laser).

When the image-forming layer containing the light-to-heat converting agent is exposed to the scanning laser beam, the light energy of the beam is converted into thermal energy. Thereby, the polymerizable compound in the heated area (imaging area) of the presensitized plate is reacted to form a hydrophobic area. At the same time, microcapsules in the heated area are broken, so that the shell polymer having been isolated with the hydrophilic compound is brought into contact with the hydrophilic support surface to form bonding. As a result, the image-forming layer in the heated area is strongly fixed on the support surface.

Figure 2:
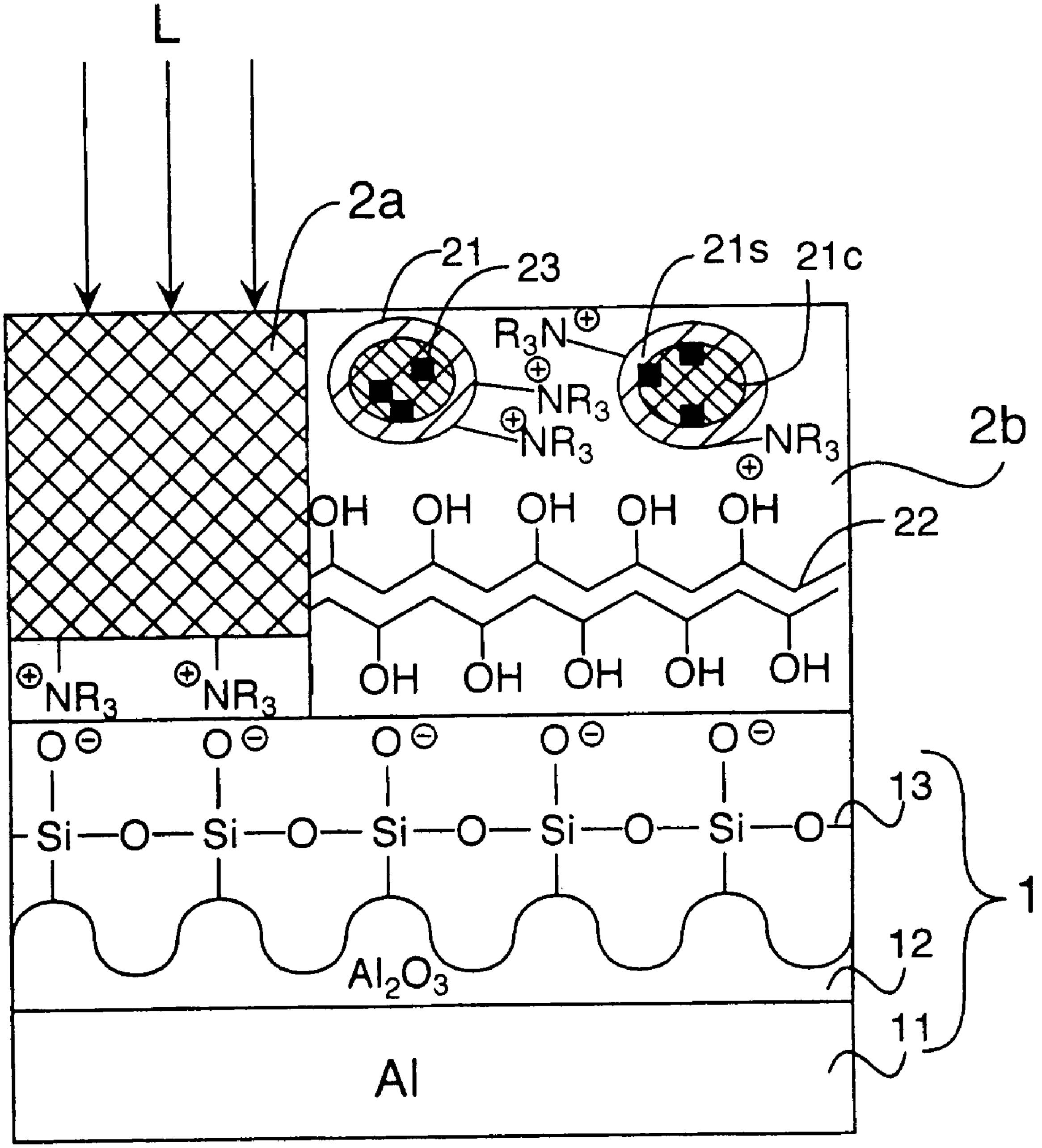
FIG. 2 is a sectional view schematically illustrating an imagewise heated presensitized lithographic plate of the first embodiment.

FIG. 2 is a sectional view schematically illustrating an imagewise heated presensitized lithographic plate of the first embodiment.

As is shown in FIG. 2, the presensitized lithographic printing plate comprising a hydrophilic support (1) and an image-forming layer (2) is imagewise exposed to light (L). The agent converts light heat to rupture the microcapsules within the heated area. In the heated area, the polymerizable compound is polymerized to form a hydrophobic area (2*a*). In the hydrophobic area (2*a*), the cationic group (—$N^+R_3$) of the shell polymer comes into contact with the anionic group (—O—) of the hydrophilic surface of the support to form an ionic bond. Therefore, the hydrophobic area (2*a*) is strongly attached to the surface of the support.

On the other hand, the unexposed area (2*b*) is not changed.

Figure 5:
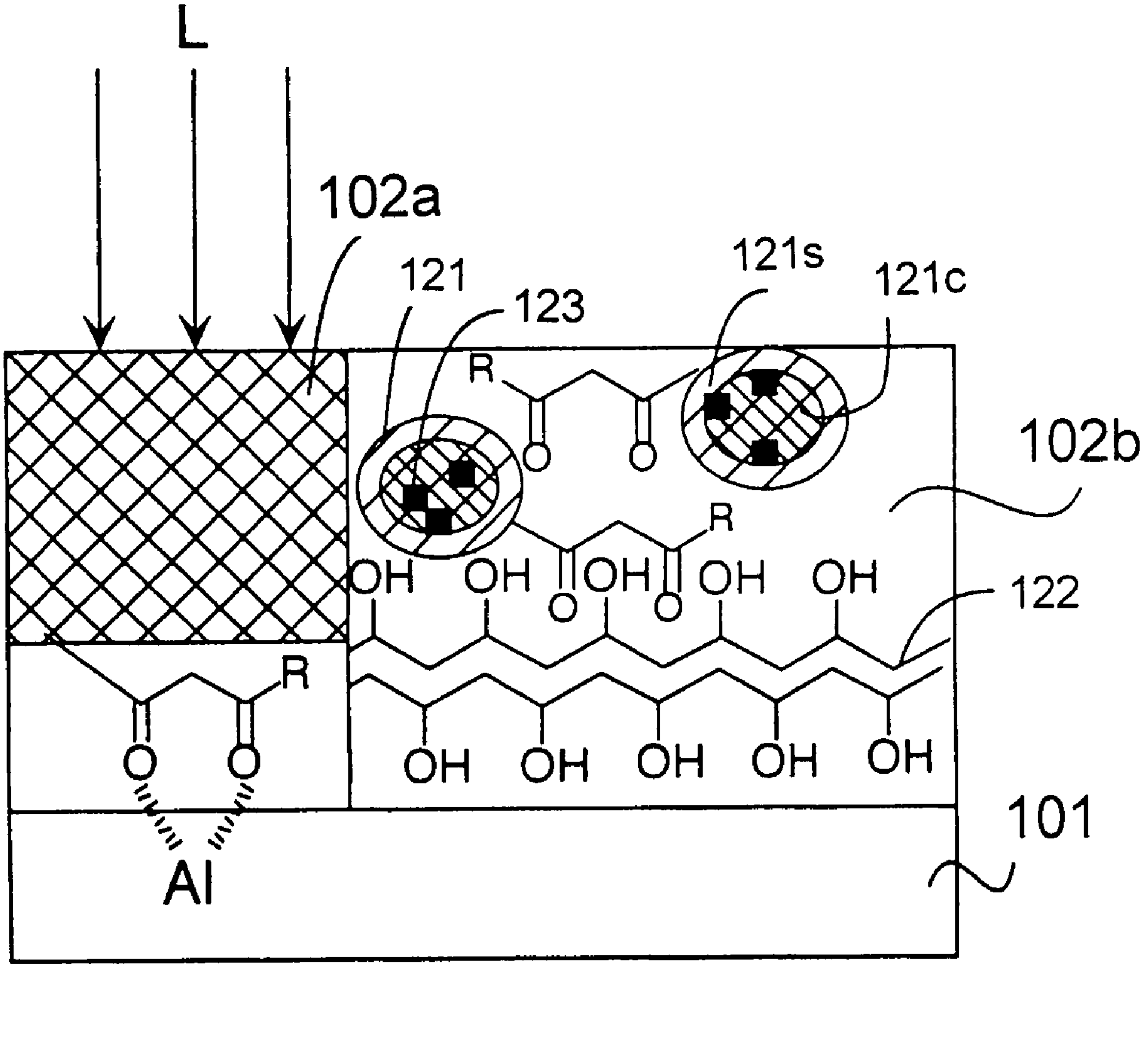
FIG. 5 is a sectional view schematically illustrating an imagewise heated presensitized lithographic plate of the second embodiment.

FIG. 5 is a sectional view schematically illustrating an imagewise heated presensitized lithographic plate of the second embodiment.

As is shown in FIG. 5, the presensitized lithographic printing plate comprising an aluminum support (101) and an image-forming layer (102) is imagewise exposed to light (L). The agent converts light heat to rupture the microcapsules within the heated area. In the heated area, the polymerizable compound is polymerized to form a hydrophobic area (102*a*). In the hydrophobic area (102*a*), the functional group (—CO—$CH_2$—CO—R) of the shell polymer comes into contact with aluminum of the support to form a complex. Therefore, the hydrophobic area (102*a*) is strongly attached to the surface of the support.

On the other hand, the unexposed area (102*b*) is not changed.

[Step of Processing and Printing]

The imagewise exposed presensitized lithographic printing plate is developed to produce a lithographic printing plate. For producing the plate, the unheated area (non-imaging area) may be removed with water or an aqueous solution. However, this procedure (developing procedure) is not necessary. In fact, immediately after imagewise heating, the heated presensitized plate is installed in a printer and subjected to usual printing, and thereby the production of the printing plate and the printing are continuously carried out. In other wards, first the imagewise heated presensitized plate is installed in a printer, and then the printer is worked so that the unheated area (non-imaging area) of the image-forming layer is removed with dampening water or ink in printing.

If a printer equipped with a laser-exposing apparatus (disclosed in Japanese Patent No. 2,938,398) is used, it is possible to carried out the process comprising the steps of: installing the presensitized plate on the cylinder of the printer, exposing the plate to a ray from the laser of the printer, and subjecting the plate to press development with dampening water and ink. Thus, the steps of exposure to printing can be continuously carried out.

Further, it is also possible to heat again the whole produced printing plate so that the unreacted compounds remaining in the imaging area may react to further improve the endurance (plate wear) of the printing plate.

Figure 3:
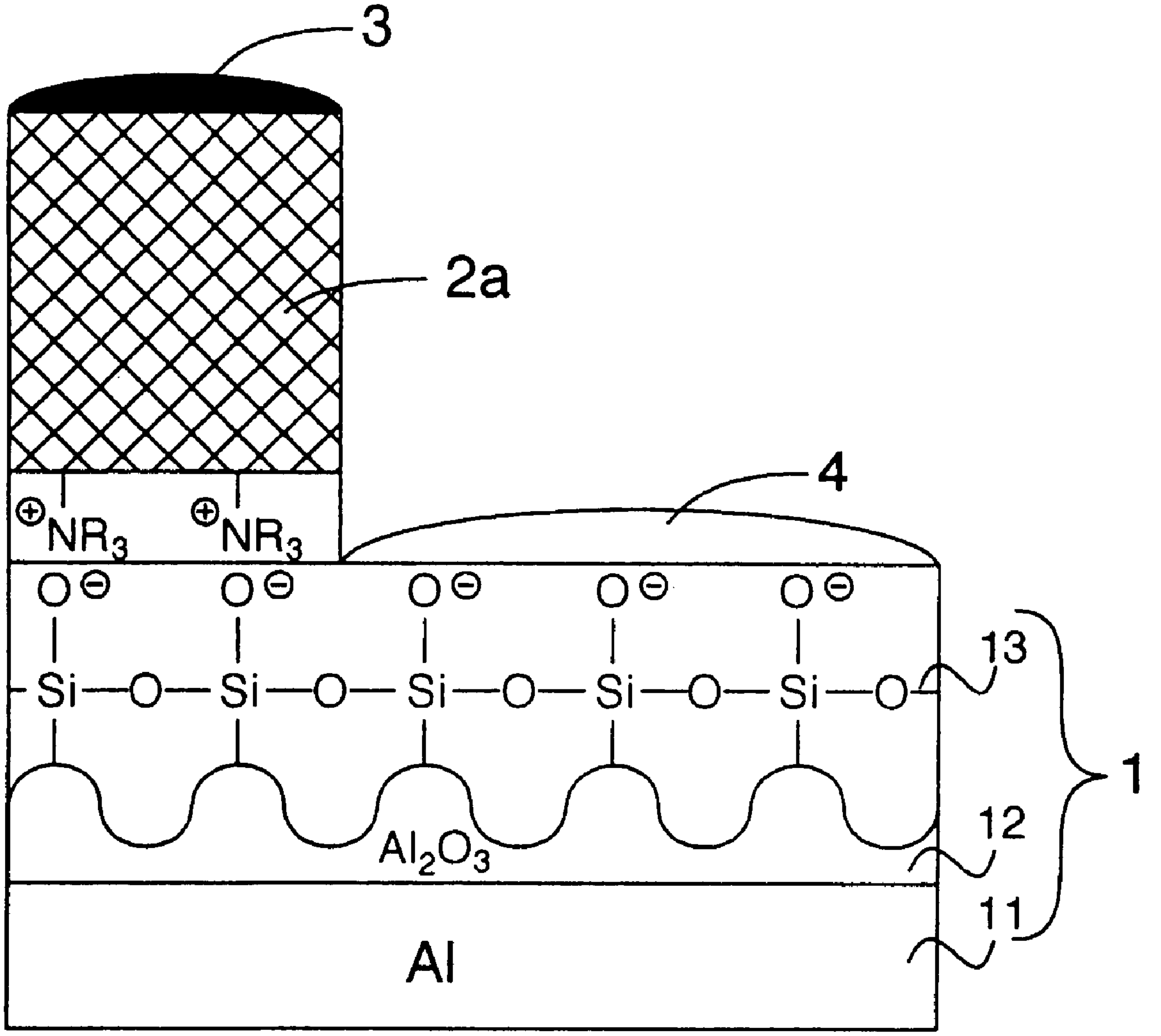
FIG. 3 is a sectional view schematically illustrating a printing process using a lithographic plate of the first embodiment.

FIG. 3 is a sectional view schematically illustrating a printing process using a lithographic plate of the first embodiment.

As is shown in FIG. 3, the remaining image-forming layer (2*a*) functions as a hydrophobic area to which oily ink (3) is attached.

On the other hand, the exposed hydrophilic support (1) functions as a hydrophilic area to which dampening water (3) is attached.

Figure 6:
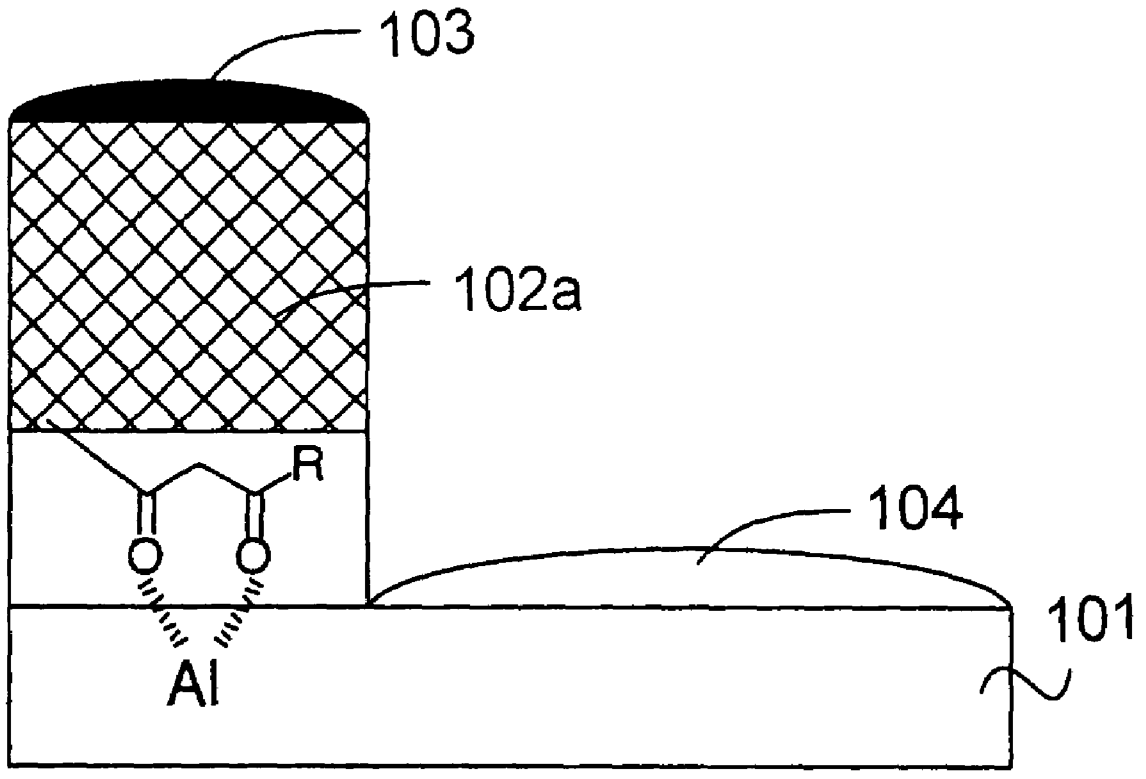
FIG. 6 is a sectional view schematically illustrating a printing process using a lithographic plate of the second embodiment.

FIG. 6 is a sectional view schematically illustrating a printing process using a lithographic plate of the second embodiment.

As is shown in FIG. 6, the remaining image-forming layer (102*a*) functions as a hydrophobic area to which oily ink (103) is attached.

On the other hand, the exposed hydrophilic support (101) functions as a hydrophilic area to which dampening water (103) is attached.

EXAMPLE 1

(Preparation of Aluminum Support)

Melt of JIS-A-1050 alloy containing Al (99.5 wt. % or more), Fe (0.30 wt. %), Si (0.10 wt. %), Ti (0.02 wt. %) and Cu (0.013 wt. %) was cleaned and molded. For cleaning the melt, the melt was degassed to remove contaminating gases (such as hydrogen gas), and then filtrated through a ceramic tube filter. For molding the melt, the DC molding was carried out. The solidified molded metal was in the form of a plate having 500 mm thickness. The plate was planed off by 10 mm, and then subjected to uniforming treatment at 550° C. for 10 hours so that the intermetallic compounds might not agglomerate. After hot rolling at 400° C., the plate was annealed at 500° C. for 60 seconds in an annealing furnace. The plate was then subjected to cold rolling to obtain an aluminum plate having 0.30 mm thickness. The surface of the rolling mill was beforehand controlled to have such roughness that the aluminum plate might have a central surface roughness (Ra) of 0.2 μm. The aluminum plate was then installed in a tension leveler to improve the planeness.

Then, the obtained plate was subjected to the following surface treatments, to form a support of lithographic printing plate.

First, for removing the rolling oil on the surface of the plate, the plate was subjected to oil-removing treatment with a 10 wt. % aqueous solution of sodium aluminate at 50° C. for 30 seconds. The plate was then neutralized with a 30 wt. % aqueous solution of sulfuric acid at 50° C. for 30 seconds, and the smut was removed.

Second, for improving adhesion between the support and the image-forming layer and for making the non-imaging area keep enough water, the plate surface was subjected to roughing treatment (what is called sand roughing). In an aqueous solution containing nitric acid (1 wt. %) and aluminum nitrate (0.5 wt. %) at 45° C., the plate was subjected to electrolytic sand roughing treatment. In the treatment, while an aluminum web was left in the solution, an indirect power cell supplied an alternative current of alternative wave under the conditions of the electric current density of 20 A/dm$^2$, the duty ratio of 1:1 and the anodic electricity of 240 C/dm$^2$. After the treatment, the plate was subjected to etching treatment with a 10 wt. % aqueous solution of sodium aluminate at 50° C. for 30 seconds. The plate was then neutralized with a 30 wt. % aqueous solution of sulfuric acid at 50° C. for 30 seconds, and the smut was removed.

Further, for improving the abrasion resistance, the chemical resistance and the water retainment, an oxide film was formed on the support by anodic oxidation. In the film formation, while an aluminum web was left in a 20% aqueous solution of sulfuric acid at 35° C., an indirect power cell supplied a direct current of 14 A/dm$^2$ to electrolyze for forming an oxide film of 2.5 g/m$^2$.

After that, for ensuring hydrophilicity of the non-imaging area, the plate was subjected to silicate treatment. In the treatment, the plate was made contact with an aluminum web for 15 seconds in a 1.5 wt. % aqueous solution of sodium silicate (No. 3) at 70° C., and washed with water. The amount of attached Si was 10 Mg/m$^2$. The thus-prepared support had a central surface roughness (Ra) of 0.25 $\mu$m.

(Synthesis of Polymer Having Cationic Group and Hydroxyl)

In 220 g of 2-methoxyethanol, 47.0 g of N,N-dimethyl-N-(2-methacryloyloxyethyl)-N-(3-sulfopropyl)ammonium, 42.4 g of cyclohexyl methacrylate and 2.8 g of 2-mercaptoethanol were dissolved. The solution was heated to 70° C. under nitrogen atmosphere. To the solution, 2,2'-azobis(2,4-dimethylvaleronitrile) was added. The mixture was reacted for 6 hours. After completing the reaction, 2 kg of water was added to the reaction mixture. The precipitates were filtered off, and dried to obtain 75.3 g of a polymer having a cationic group and hydroxyl (a polymer having an ammonium group and a hydroxyl at the end of the polymer). The number average molecular weight (in terms of polystyrene according to GPC) was 2,500.

(Synthesis of Isocyanate Adduct Having Ammonium Group)

To 125 g of ethyl acetate, 75 g of the obtained polymer having a cationic group and hydroxyl and 100 g of a commercially available isocyanate adduct (Takenate D-110N, Mistui-Takeda Chemicals, Inc.) were added. After 120 mg of tin(II) octylate (Stanoct, Yoshitomi Pharmaceutical Industries) was added to the mixture in a water bath, the mixture was stirred for 1 hour. The mixture was further stirred at 50° C. for 3 hours. Thus, a 50 wt. % solution of isocyanate adduct having an ammonium group was prepared.

(Preparation of Microcapsule Dispersion)

To 35 g of ethyl acetate, 10 g of the isocyanate adduct having an ammonium group, 5 g of a commercially available isocyanate oligomer (MR200, Japan Polyurethane Industries Ltd.), 10 g of the following vinyl ether compound, 4 g of the following agent capable of converting light to heat and 0.2 g of a surface-active agent (Pionine A-41C, Takemoto oil & fat Co., Ltd.) were added to prepare an oil phase.

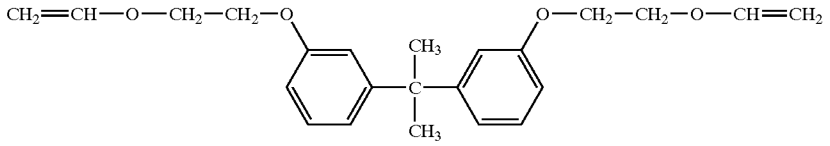

(Vinyl ether compound)

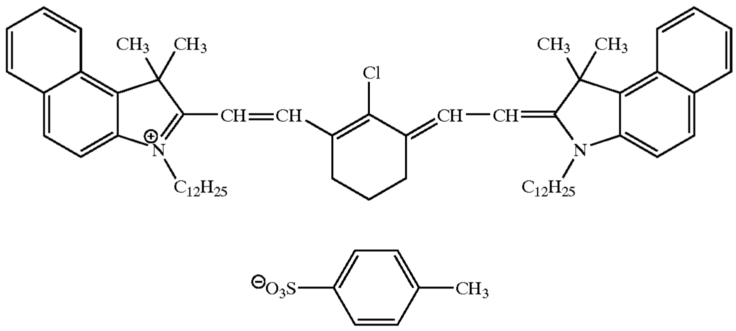

(Agent capable of converting light to heat)

Independently, 80 g of 4 wt. % aqueous solution of polyvinyl alcohol (PVA-205, Kuraray Co., Ltd.) was prepared as an aqueous phase.

The oil and aqueous phases prepared above were mixed and emulsified with a homogenizer (12,000 rpm) for 10 minutes. To the obtained emulsion, 50 g of water was added. The mixture was stirred at room temperature for 30 minutes, and further stirred at 65° C. for 3 hours to prepare microcapsule dispersion. The microcapsule dispersion was diluted with water to adjust the solid content of 20.5 wt. %. The mean size of the microcapsules was 0.40 μm.

(Formation of Image-forming Layer)

With 100 g of water, the microcapsule dispersion (solid content of the microcapsules: 5 g) and 0.5 g of the following heat-sensitive acid precursor were mixed to prepare a coating solution of an image-forming layer. The coating solution was applied with a bar coater on the aluminum support, and then dried in an oven at 80° C. for 90 seconds to form the image-forming layer in the dry coating amount of 1.0 g/$m^2$. Thus, a presensitized lithographic printing plate was produced.

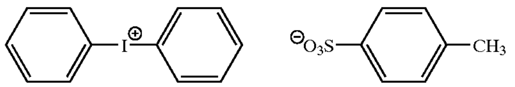

(Heat-sensitive acid precursor)

(Process, Print and Evaluation)

The above-produced presensitized plate was imagewise exposed by means of an image setter (Trendsetter 3244VX, from Creo) equipped with a water-cooling semiconductor IR laser of 40 W. The exposing conditions were so adjusted that the plate surface energy was 250 mJ/$cm^2$, and the resolution was 2,400 dpi. The contrast of the image area to the non-image area is remarkable. Therefore, the exposed image was confirmed.

Without subjecting to the developing treatment, the exposed plate was immediately installed on the cylinder of printer (Heidelberg SOR-M). Dampening water, ink and then paper were supplied to print paper.

When the unexposed area of the image-forming layer was removed to complete the press development on the printer, the ink on the unexposed area was no longer transferred onto the paper. The number of the loss paper (how many sheets of paper were printed until the press development was completed) was 30 sheets. The plate wear (how many sheets of paper were printed before the image became blurred) was 20,000 sheets.

EXAMPLE 2

(Preparation of Microcapsule Dispersion)

To 30 g of ethyl acetate, 30 g of the isocyanate adduct prepared in Example 1, 10 g of pentaerythritol tetraacrylate (NK Ester a-TMMT, Shin-Nakamura Chemical Industries Ltd.), 4 g of the agent capable of converting light to heat used in Example 1 and 0.2 g of a surface-active agent (Pionine A-41C, Takemoto oil & fat Co., Ltd.) were added to prepare an oil phase.

Independently, 80 g of 4 wt. % aqueous solution of polyvinyl alcohol (PVA-205, Kuraray Co., Ltd.) was prepared as an aqueous phase.

The oil and aqueous phases prepared above were mixed and emulsified with a homogenizer (12,000 rpm) for 10 minutes. To the obtained emulsion, 50 g of 1 wt. % aqueous solution of tetraethylene pentamine was added. The mixture was stirred at room temperature for 30 minutes and further stirred at 65° C. for 3 hours to prepare microcapsule dispersion. The microcapsule dispersion was diluted with water to adjust the solid content of 20.8 wt. %. The mean size of the microcapsules was 0.32 μm.

(Formation of Image-forming Layer)

An image-forming layer was formed to prepare a presensitized lithographic plate in the same manner as in Example 1, except that the prepared microcapsule dispersion was used. In the formed image-forming layer, the heat-sensitive acid precursor used in Example 1 functions as a thermal polymerization initiator (not functions as the acid precursor).

(Process, Print and Evaluation)

The presensitized lithographic printing plate was processed in the same manner as in Example 1 to prepare a printing plate. Paper was printed using the plate, and evaluated. As a result, the number of the loss paper was 25 sheets, and the plate wear was 14,000 sheets.

EXAMPLE 3

(Synthesis of Alcohol Having Ammonium Group)

To 200 g of acetone, 117 g of N,N-diethylethanolamine and 116 g of iodomethane were dissolved. The solution was left for one day. The precipitated white solid was filtered off, and dispersed in 200 g of acetone again. The dispersion was filtered off, and dried to obtain 210 g of N,N,N-triethyl-N-(2-hydroxyethyl)ammonium iodide.

In 50 g of water, 28 g of N,N,N-triethyl-N-(2-hydroxyethyl)ammuonium iodide was dissolved. The obtained aqueous solution was mixed with a solution of 19 g of sodium hexafluorophosphate in 50 g of water. The mixture was stirred for 1 hour. The precipitate was filtered off and dried to obtain 19 g of N,N,N-triethyl-N-(2-hydroxyethyl)ammonium hexafluorophosphate.

(Synthesis of Isocyanate Adduct Having Ammonium Group)

In 39 g of ethyl acetate, 6 g of N,N,N-triethyl-N-(2-hydroxyethyl)ammonium hexafluorophosphate and 65 g of a commercially available isocyanate adduct (Takenate D-110N, Mistui-Takeda Chemicals, Inc.) were added. After 120 mg of tin-(II) octylate (Stanoct, Yoshitomi Pharmaceutical Industries) was added to the mixture in a water bath, the mixture was stirred for 1 hour. The mixture was further stirred at 50° C. for 3 hours. Thus, a 50 wt. % solution of isocyanate adduct having an ammonium group was prepared.

(Preparation of Microcapsule Dispersion)

To 30 g of ethyl acetate, 30 g of the isocyanate adduct having an ammonium group, 10 g of the vinyl ether compound used in Example 1, 4 g of the agent capable of converting light to heat used in Example 1 and 0.2 g of a surface-active agent (Pionine A-41C, Takemoto oil & fat Co., Ltd.) were added to prepare an oil phase.

Independently, 80 g of 4 wt. % aqueous solution of polyvinyl alcohol (PVA-205, Kuraray Co., Ltd.) was prepared as an aqueous phase.

The oil and aqueous phases prepared above were mixed and emulsified with a homogenizer (12,000 rpm) for 10 minutes. To the obtained emulsion, 50 g of water was added. The mixture was stirred at room temperature for 30 minutes, and further stirred at 65° C. for 3 hours to prepare microcapsule dispersion. The microcapsule dispersion was diluted with water to adjust the solid content of 20.5 wt. %. The mean size of the microcapsules was 0.40 μm.

(Formation of Image-forming Layer)

An image-forming layer was formed to prepare a presensitized lithographic plate in the same manner as in Example 1, except that the prepared microcapsule dispersion was used.

(Process, Print and Evaluation)

The presensitized lithographic printing plate was processed in the same manner as in Example 1 to prepare a printing plate. Paper was printed using the plate, and evaluated. As a result, the number of the loss paper was 22 sheets, and the plate wear was 12,000 sheets.

EXAMPLE 4

(Preparation of Microcapsule Dispersion)

To 30 g of ethyl acetate, 30 g of the isocyanate adduct prepared in Example 3, 10 g of pentaerythritol tetraacrylate (NK Ester a-TMMT, Shin-Nakamura Chemical Industries Ltd.), 4 g of the agent capable of-converting light to heat used in Example 1 and 0.2 g of a surface-active agent (Pionine A-41C, Takemoto oil & fat Co., Ltd.) were added to prepare an oil phase.

Independently, 80 g of 4 wt. % aqueous solution of polyvinyl alcohol (PVA-205, Kuraray Co., Ltd.) was prepared as an aqueous phase.

The oil and aqueous phases prepared above were mixed and emulsified with a homogenizer (12,000 rpm) for 10 minutes. To the obtained emulsion, 50g of 1 wt. % aqueous solution of p-phenylenediamine was added. The mixture was stirred at room temperature for 30 minutes and further stirred at 65° C. for 3 hours to prepare microcapsule dispersion. The microcapsule dispersion was diluted with water to adjust the solid content of 20.6 wt. %. The mean size of the microcapsules was 0.36 $\mu$m.

(Formation of Image-forming Layer)

An image-forming layer was formed to prepare a presensitized lithographic plate in the same manner as in Example 1, except that the prepared microcapsule dispersion was used. In the formed image-forming layer, the heat-sensitive acid precursor used in Example 1 functions as a thermal polymerization initiator (not functions as the acid precursor).

(Process, Print and Evaluation)

The presensitized lithographic printing plate was processed in the same manner as in Example 1 to prepare a printing plate. Paper was printed using the plate, and evaluated. As a result, the number of the loss paper was 23 sheets, and the plate wear was 10,000 sheets.

EXAMPLE 5

(Synthesis of Isocyanate Adduct Having Function of Forming Aluminum Complex)

To 38.0 g of ethyl acetate, 5.4 g of 2-hydroxyethyl acetoacetate and 65.2 g of a commercially available isocyanate adduct (Takenate D-110N, Mistui-Takeda Chemicals, Inc.) were added. After 120 mg of tin(II) octylate (Stanoct, Yoshitomi Pharmaceutical Industries) was added to the mixture in a water bath, the mixture was stirred for 1 hour. The mixture was further stirred at 50° C. for 3 hours. Thus, a 50 wt. % solution of isocyanate adduct having a functional group of forming aluminum complex.

(Preparation of Microcapsule Dispersion)

To 35 g of ethyl acetate, 10 g of the isocyanate adduct having a functional group of forming aluminum complex, 5 g of a commercially available isocyanate oligomer (MR200, Japan Polyurethane Industries Ltd.), 10 g of the vinyl ether compound used in Example 1, 4 g of the agent capable of converting light to heat used in Example 1 and 0.2 g of a surface-active agent (Pionine A-41C, Takemoto oil & fat Co., Ltd.) were added to prepare an oil phase.

Independently, 80 g of 4 wt. % aqueous solution of polyvinyl alcohol (PVA-205, Kuraray Co., Ltd.) was prepared as an aqueous phase.

The oil and aqueous phases prepared above were mixed and emulsified with a homogenizer (12,000 rpm) for 10 minutes. To the obtained emulsion, 50 g of water was added. The mixture was stirred at room temperature for 30 minutes, and further stirred at 65° C. for 3 hours to prepare microcapsule dispersion. The microcapsule dispersion was diluted with water to adjust the solid content of 20.6 wt. %. The mean size of the microcapsules was 0.36 $\mu$m.

(Formation of Image-forming Layer)

With 100 g of water, the microcapsule dispersion (solid content of the microcapsules: 5 g) and 0.5 g of the heat-sensitive acid precursor used in Example 1 were mixed to prepare a coating solution of an image-forming layer. The coating solution was applied with a bar coater on the aluminum support, and then dried in an oven at 80° C. for 90 seconds to form the image-forming layer in the dry coating amount of 1.0 g/m$^2$. Thus, a presensitized lithographic printing plate was produced.

(Process, Print and Evaluation)

The above-produced presensitized plate was imagewise exposed by means of an image setter (Trendsetter 3244VX, from Creo) equipped with a water-cooling semiconductor IR laser of 40 W. The exposing conditions were so adjusted that the plate surface energy was 250 mJ/cm$^2$, and the resolution was 2,400 dpi. The contrast of the image area to the non-image area is remarkable. Therefore, the exposed image was confirmed.

Without subjecting to the developing treatment, the exposed plate was immediately installed on the cylinder of printer (Heidelberg SOR-M). Dampening water, ink and then paper were supplied to print paper.

When the unexposed area of the image-forming layer was removed to complete the press development on the printer, the ink on the unexposed area was no longer transferred onto the paper. The number of the loss paper (how many sheets of paper were printed until the press development was completed) was 25 sheets. The plate wear (how many sheets of paper were printed before the image became blurred) was 10,000 sheets.

EXAMPLE 6

(Preparation of Microcapsule Dispersion)

To 30 g of ethyl acetate, 30 g of the isocyanate adduct having a functional group of forming aluminum complex prepared in Example 5, 10 g of pentaerythritol tetraacrylate (NK Ester a-TMMT, Shin-Nakamura Chemical Industries Ltd.), 4 g of the agent capable of converting light to heat used in Example 1 and 0.2 g of a surface-active agent (Pionine A-41C, Takemoto oil & fat Co., Ltd.) were added to prepare an oil phase.

Independently, 80 g of 4 wt. % aqueous solution of polyvinyl alcohol (PVA-205, Kuraray Co., Ltd.) was prepared as an aqueous phase.

The oil and aqueous phases prepared above were mixed and emulsified with a homogenizer (12,000 rpm) for 10 minutes. To the obtained emulsion, 50g of 1 wt. % aqueous solution of tetraethylene pentamine was added. The mixture was stirred at room temperature for 30 minutes and further stirred at 65° C. for 3 hours to prepare microcapsule dispersion. The microcapsule dispersion was diluted with water to adjust the solid content of 20.5 wt. %. The mean size of the microcapsules was 0.40 μm.

(Formation of Image-forming Layer)

An image-forming layer was formed to prepare a presensitized lithographic plate in the same manner as in Example 5, except that the prepared microcapsule dispersion was used. In the formed image-forming layer, the heat-sensitive acid precursor used in Example 5 functions as a thermal polymerization initiator (not functions as the acid precursor).

(Process, Print and Evaluation)

The presensitized lithographic printing plate was processed in the same manner as in Example 5 to prepare a printing plate. Paper was printed using the plate, and evaluated. As a result, the number of the loss paper was 29 sheets, and the plate wear was 9,000 sheets.

EXAMPLE 7

(Synthesis of Isocyanate Adduct Having Function of Forming Aluminum Complex)

To 37.2 g of ethyl acetate, 4.6 g of 4-(2-hydroxyethyl) pyridine and 65.2 g of a commercially available isocyanate adduct (Takenate D-110N, Mistui-Takeda Chemicals, Inc.) were added. After 120 mg of tin(II) octylate (Stanoct, Yoshitomi Pharmaceutical Industries) was added to the mixture in a water bath, the mixture was stirred for 1 hour. The mixture was further stirred at 50° C. for 3 hours. Thus, a 50 wt. % solution of isocyanate adduct having a functional group (pyridinyl group) of forming aluminum complex.

(Preparation of Microcapsule Dispersion)

To 30 g of ethyl acetate, 30 g of the isocyanate adduct having a functional group of forming aluminum complex, 10 g of the vinyl ether compound used in Example 1, 4 g of the agent capable of converting light to heat used in Example 1 and 0.2 g of a surface-active agent (Pionine A-41C, Takemoto oil & fat Co., Ltd.) were added to prepare an oil phase.

Independently, 80 g of 4 wt. % aqueous solution of polyvinyl alcohol (PVA-205, Kuraray Co., Ltd.) was prepared as an aqueous phase.

The oil and aqueous phases prepared above were mixed and emulsified with a homogenizer (12,000 rpm) for 10 minutes. To the obtained emulsion, 50 g of water was added. The mixture was stirred at room temperature for 30 minutes, and further stirred at 65° C. for 3 hours to prepare microcapsule dispersion. The microcapsule dispersion was diluted with water to adjust the solid content of 20.6 wt. %. The mean size of the microcapsules was 0.29 μm.

(Formation of Image-forming Layer)

An image-forming layer was formed to prepare a presensitized lithographic plate in the same manner as in Example 5, except that the prepared microcapsule dispersion was used.

(Process, Print and Evaluation)

The presensitized lithographic printing plate was processed in the same manner as in Example 5 to prepare a printing plate. Paper was printed using the plate, and evaluated. As a result, the number of the loss paper was 26 sheets, and the plate wear was 9,000 sheets.

EXAMPLE 8

(Preparation of Microcapsule Dispersion)

To 30 g of ethyl acetate, 10 g of the isocyanate adduct having a functional group of forming aluminum complex prepared in Example 7, 10 g of pentaerythritol tetraacrylate (NK Ester a-TMMT, Shin-Nakamura Chemical Industries Ltd.), 4 g of the agent capable of converting light to heat used in Example 1 and 0.2 g of a surface-active agent (Pionine A-41C, Takemoto oil & fat Co., Ltd.) were added to prepare an oil phase.

Independently, 80 g of 4 wt. % aqueous solution of polyvinyl alcohol (PVA-205, Kuraray Co., Ltd.) was prepared as an aqueous phase.

The oil and aqueous phases prepared above were mixed and emulsified with a homogenizer (12,000 rpm) for 10 minutes. To the obtained emulsion, 50 g of 1 wt. % aqueous solution of p-phenylenediamine was added. The mixture was stirred at room temperature for 30 minutes and further stirred at 65° C. for 3 hours to prepare microcapsule dispersion. The microcapsule dispersion was diluted with water to adjust the solid content of 20.6 wt. %. The mean size of the microcapsules was 0.36 μm.

(Formation of Image-forming Layer)

An image-forming layer was formed to prepare a presensitized lithographic plate in the same manner as in Example 5, except that the prepared microcapsule dispersion was used. In the formed image-forming layer, the heat-sensitive acid precursor used in Example 5 functions as a thermal polymerization initiator (not functions as the acid precursor).

(Process, Print and Evaluation)

The presensitized lithographic printing plate was processed in the same manner as in Example 5 to prepare a printing plate. Paper was printed using the plate, and evaluated. As a result, the number of the loss paper was 24 sheets, and the plate wear was 10,000 sheets.

EXAMPLE 9

(Synthesis of Isocyanate Adduct Having Lactone Ring)

To 24.2 g of ethyl acetate, 4.2 g of the lactone compound (1) and 40 g of a commercially available isocyanate adduct (Takenate D-110N, Mistui-Takeda Chemicals, Inc.) were added. After 120 mg of tin(II) octylate (Stanoct, Yoshitomi Pharmaceutical Industries) was added, the mixture was stirred for 1 hour. The mixture was further stirred at 50° C. for 3 hours. Thus, a 5.0 wt. % solution of isocyanate adduct having a lactone ring was prepared.

(Preparation of Microcapsule Dispersion)

To 17 g of ethyl acetate, 10 g of the isocyanate adduct having a lactone ring, pentaerythritol triacrylate (SR444, Nippon Kayaku Co., Ltd.), 0.3 g of the agent capable of converting light to heat, 1 g of 3-(N,N-diethylamino)-6-methyl-7-anilinofluoran (ODB, Yamamoto Chemicals, Inc.) and 0.1 g of a surface-active agent (Pionine A-41C, Takemoto oil & fat Co., Ltd.) were added to prepare an oil phase.

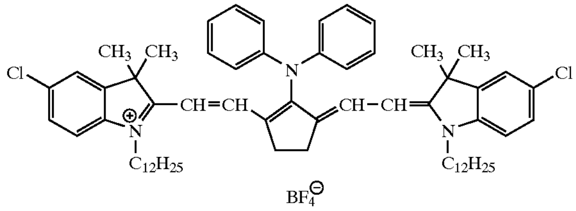

(Agent capable of converting light to heat)

Independently, 40 g of 4 wt. % aqueous solution of polyvinyl alcohol (PVA-205, Kuraray Co., Ltd.) was prepared as an aqueous phase.

The oil and aqueous phases prepared above were mixed and emulsified with a homogenizer (12,000 rpm) for 10 minutes. The obtained emulsion was added to 25 g of distilled water, and stirred at room temperature for 30 minutes and further stirred at 40° C. for 3 hours. The thus-prepared liquid dispersing microcapsules (1) was diluted with water so that the solid content might be 20 wt. %. The mean size of the microcapsules was 0.3 μm.

(Formation of Image-forming Layer)

The coating solution consisting of the following components was prepared and applied with a bar coater on the aluminum support, and then dried in an oven at 70° C. for 60 seconds to form the image-forming layer in the amount of 0.8 g/$m^2$ (dry condition). Thus, a presensitized lithographic printing plate was produced.

| Coating solution for image-forming layer | |
|---|---|
| Water | 100 g |
| The microcapsule dispersion | 5 g |
| The following thermal polymerization initiator | 0.5 g |
| The following fluorine-containing surface-active agent | 0.2 g |

(Thermal polymerization initiator)

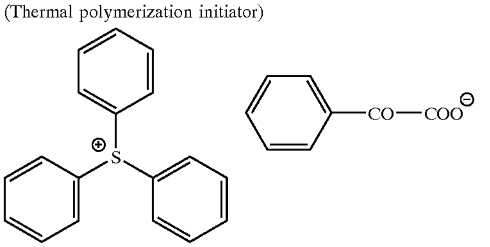

(Fluorine-containing surface-active agent)

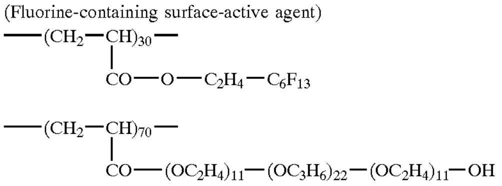

(Processing and Printing)

The above-produced presensitized plate was imagewise exposed by means of an image setter (Trendsetter 3244VX, from Creo) equipped with a water-cooling semiconductor IR laser of 40 W. The exposing conditions were the laser power of 17 W, the outer drum rotation of 133 rpm and the resolution of 2,400 dpi. The exposed image included a fine-line chart (fine lines of 10, 12, 14, 16, 18, 2.0, 25, 30, 35, 40, 60, 80, 100 and 200 μm were exposed).

Without subjecting to the developing treatment, the exposed plate was immediately installed on the cylinder of printer (Heidelberg SOR-M). As the dampening water, a mixture of etching solution (EU-3, Fuji Photo Film Co., Ltd.)/water/iso-propyl alcohol [1/89/10 by volume]) was supplied. While black ink (TRANS-G(N), Dainippon Ink & Chemicals, Inc.) was further supplied, 100 sheets of paper were printed at the rate of 6,000 sheets per hour.

When the unexposed area of the image-forming layer was removed to complete the press development on the printer, the ink on the unexposed area was no longer transferred onto the paper. How many sheets of paper were printed until the press development was completed was counted, and thereby the suitability for press development was evaluated.

The results were set forth in Table 1.

(Reproducibility of Fine-line Chart)

After 100 sheets of paper were printed, it was confirmed that the ink on the unexposed area was no longer transferred onto the paper. Then, 500 sheets of paper were further printed. The fine-line charts printed on the 600 sheets of paper in total were then observed through a 25-power loupe to find how thin lines were reproduced without breaks, and thereby the reproducibility of fine lines was evaluated. The thinner lines were reproduced, the higher sensitivity the presensitized plate had.

The results were set forth in Table 1.

(Plate Wear)

After the above printing for evaluating the fine-line reproducibility was conducted, the printing was furthermore continued. According as the sheets of printed paper increased, the image-forming layer gradually wore down and less received ink so that the density of ink on the printed paper was lowered. It was counted how many sheets of paper were printed until the ink density (reflection density) faded by 0.1 based on the beginning of printing, and thereby the plate wear was evaluated.

The results were set forth in Table 1.

EXAMPLES 10 TO 13

The procedure of Example 1 was repeated except that the above-shown lactone ring-introduced compound (3), (5), (6) or (10) was used in place of the lactone ring-introduced compound (1), to produce a presensitized lithographic printing plate. The produced plate was evaluated in the same manner as in Example 1. The results were set forth in Table 1.

COMPARISON EXAMPLE 1

(Formation of Image-forming Layer)

The procedure of Example 1 was repeated except that a commercially available isocyanate adduct (Takenate D-110N, Mistui-Takeda Chemicals, Inc.) was directly used in place of the lactone ring-introduced isocyanate adduct, to produce a presensitized lithographic printing plate. The produced plate was evaluated in the same manner as in Example 1. The results were set forth in Table 1.

TABLE 1

| Presensitized plate | Lactone compound | Suitability for press development | Fine-line reproducibility | Plate wear |
|---|---|---|---|---|
| Example 9 | (1) | 20 sheets | 18 $\mu$m | 5,000 sheets |
| Example 10 | (3) | 20 sheets | 18 $\mu$m | 4,000 sheets |
| Example 11 | (5) | 20 sheets | 16 $\mu$m | 6.000 sheets |
| Example 12 | (6) | 30 sheets | 16 $\mu$m | 7.000 sheets |
| Example 13 | (10) | 25 sheets | 16 $\mu$m | 6,000 sheets |
| Comp. Ex. 1 | None | 20 sheets | 20 $\mu$m | 3,000 sheets |

The invention claimed is:

1. A presensitized lithographic printing plate which comprises a hydrophilic support and an image-forming layer containing microcapsules dispersed in the image forming layer and a hydrophilic compound arranged outside of the microcapsules, wherein the microcapsules comprise a core comprising a polymerizable compound and a shell comprising a polymer which has adherence to a surface of the hydrophilic support, and wherein the polymer of the shell has a cationic group, the hydrophilic compound arranged outside of the microcapsules has a nonionic hydrophilic group, and the hydrophilic surface of the support has an anionic group.

2. The presensitized lithographic printing plate as defined in claim 1, wherein the cationic group is an onium group.

3. The presensitized lithographic printing plate as defined in claim 2, wherein the opium group is selected from the group consisting of an ammonium group, a phosphonium group, a sulfonium group and an iodonium group.

4. The presensitized lithographic printing plate as defined in claim 1, wherein the polymer of the shell is a reaction product of an alcohol, a phenol, a thiol or an amine with a polyisocyanate, said alcohol, phenol, thiol or amine having the cationic group.

5. The presensitized lithographic printing plate as defined in claim 1, wherein the hydrophilic support is aluminum plate having an anodic oxidation coating subjected to a silicate treatment.

6. A presensitized lithographic printing plate which comprises a hydrophilic support and an image-forming layer containing microcapsules dispersed in the image forming layer and a hydrophilic compound arranged outside of the microcapsules, wherein the microcapsules comprise a core comprising a polymerizable compound and a shell comprising a polymer which has adherence to a surface of the hydrophilic support, and the hydrophilic support is an aluminum plate, and wherein the polymer of the shell has a group having a function of forming an aluminum complex.

7. The presensitized lithographic printing plate as defined in claim 6, wherein the group having the function of forming the aluminum complex comprises two carbonyl groups between which one carbon atom intervenes.

8. The presensitized lithographic printing plate as defined in claim 6, wherein the group having the function of forming the aluminum complex contains nitrogen atom having an unshared electron pair.

9. The presensitized lithographic printing plate as defined in claim 6, wherein the polymer of the shell is a reaction product of an alcohol, a phenol, a thiol or an amine with a polyisocyanate, said alcohol, phenol, thiol or amine having the group having the function of forming the aluminum complex.

10. A presensitized lithographic printing plate which comprises a hydrophilic support and an image-forming layer containing microcapsules dispersed in the image forming layer and a hydrophilic compound arranged outside of the microcapsules, wherein the microcapsules comprise a core comprising a polymerizable compound and a shell comprising a polymer which has adherence to a surface of the hydrophilic support, and wherein the polymer of the shell has a lactone ring.

11. The presensitized lithographic printing plate as defined in claim 10, wherein the lactone ring is a five-membered ring or a six-membered ring.

12. The presensitized lithographic printing plate as defined in claim 10, wherein the polymer of the shell is a reaction product of an alcohol, a phenol, a thiol or an amine with a polyisocyanate, said alcohol, phenol, thiol or amine having the lactone ring.

13. The presensitized lithographic printing plate as defined in claim 1, wherein the polymer of the shell has a urethane bond or a urea bond in a main chain of the polymer.

14. The presensitized lithographic printing plate as defined in claim 1, wherein the polymer of the shell is a reaction product of an alcohol, a phenol, a thiol or an amine with a polyisocyanate.

15. The presensitized lithographic printing plate as defined in claim 14, wherein the polyisocyanate is an adduct of a polyol with diisocyanate.

16. The presensitized lithographic printing plate as defined in claim 15, wherein the diisocyanate is xylylene diisocyanate.

17. The presensitized lithographic printing plate as defined in claim 1, wherein the polymerizable compound has a vinyl ether group or an epoxy group, and the image-forming layer further contains a heat-sensitive acid precursor.

18. The presensitized lithographic printing plate as defined in claim 1, wherein the polymerizable compound has an ethylenically unsaturated group, and the image-forming layer further contains a thermal polymerization initiator.

19. The presensitized lithographic printing plate as defined in claim 1, wherein the image-forming layer or another optional layer further contains an agent capable of converting light to heat.

20. The presensitized lithographic printing plate as defined in claim 1, wherein the hydrophilic support is an aluminum plate.

21. The presensitized lithographic printing plate as defined in claim 6, wherein the polymer of the shell has a urethane bond or a urea bond in a main chain of the polymer.

22. The presensitized lithographic printing plate as defined in claim 6, wherein the polymer of the shell is a reaction product of an alcohol, a phenol, a thiol or an amine with a polyisocyanate.

23. The presensitized lithographic printing plate as defined in claim 22, wherein the polyisocyanate is an adduct of a polyol with diisocyanate.

24. The presensitized lithographic printing plate as defined in claim 23, wherein the diisocyanate is xylylene diisocyanate.

25. The presensitized lithographic printing plate as defined in claim 6, wherein the polymerizable compound has a vinyl ether group or an epoxy group, and the image-forming layer further contains a heat-sensitive acid precursor.

26. The presensitized lithographic printing plate as defined in claim 6, wherein the polymerizable compound has an ethylenically unsaturated group, and the image-forming layer further contains a thermal polymerization initiator.

27. The presensitized lithographic printing plate as defined in claim 6, wherein the image-forming layer or another optional layer further contains an agent capable of converting light to heat.

28. The presensitized lithographic printing plate as defined in claim 10, wherein the polymer of the shell has a urethane bond or a urea bond in a main chain of the polymer.

29. The presensitized lithographic printing plate as defined in claim 10, wherein the polymer of the shell is a reaction product of an alcohol, a phenol, a thiol or an amine with a polyisocyanate.

30. The presensitized lithographic printing plate as defined in claim 29, wherein the polyisocyanate is an adduct of a polyol with diisocyanate.

31. The presensitized lithographic printing plate as defined in claim 30, wherein the diisocyanate is xylylene diisocyanate.

32. The presensitized lithographic printing plate as defined in claim 10, wherein the polymerizable compound has a vinyl ether group or an epoxy group, and the image-forming layer further contains a heat-sensitive acid precursor.

33. The presensitized lithographic printing plate as defined in claim 10, wherein the polymerizable compound has an ethylenically unsaturated group, and the image-forming layer further contains a thermal polymerization initiator.

34. The presensitized lithographic printing plate as defined in claim 10, wherein the image-forming layer or another optional layer further contains an agent capable of converting light to heat.

35. The presensitized lithographic printing plate as defined in claim 10, wherein the hydrophilic support is an aluminum plate.

* * * * *